(12) United States Patent
Werhane et al.

(10) Patent No.: US 10,330,726 B2
(45) Date of Patent: Jun. 25, 2019

(54) APPARATUSES INCLUDING TEST SEGMENT CIRCUITS HAVING LATCH CIRCUITS FOR TESTING A SEMICONDUCTOR DIE

(71) Applicant: MICRON TECHNOLOGY, INC., Boise, ID (US)

(72) Inventors: Kevin G. Werhane, Kuna, ID (US); Nathaniel J. Meier, Boise, ID (US); Bin Liu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 93 days.

(21) Appl. No.: 15/626,941

(22) Filed: Jun. 19, 2017

(65) Prior Publication Data

US 2018/0364303 A1 Dec. 20, 2018

(51) Int. Cl.
| | |
|---|---|
| *G01R 31/26* | (2014.01) |
| *G01R 31/307* | (2006.01) |
| *G01R 31/30* | (2006.01) |
| *H03L 7/081* | (2006.01) |
| *H03K 5/133* | (2014.01) |
| *H01J 37/26* | (2006.01) |

(52) U.S. Cl.
CPC ....... *G01R 31/307* (2013.01); *G01R 31/3016* (2013.01); *H01J 37/266* (2013.01); *H03K 5/133* (2013.01); *H03L 7/0812* (2013.01)

(58) Field of Classification Search
CPC ... H01L 22/34; H01L 23/522; H01L 29/4916; G01R 31/2884; G01R 27/16; G01R 31/048; G01R 31/2856; G01R 31/3016; G01R 31/307; H01J 37/266; H03L 7/0812
See application file for complete search history.

(56) References Cited

U.S. PATENT DOCUMENTS

| | | | |
|---|---|---|---|
| 6,449,748 B1* | 9/2002 | Jeng | G01R 31/3173 257/48 |
| 7,791,070 B2* | 9/2010 | Huang | H01L 23/585 257/48 |
| 9,287,184 B2* | 3/2016 | Dennison | H01L 22/14 |
| 9,768,129 B2* | 9/2017 | Lee | H01L 23/573 |
| 2011/0221460 A1* | 9/2011 | Trebo | G01R 31/2884 324/750.3 |

* cited by examiner

*Primary Examiner* — Vinh P Nguyen
(74) *Attorney, Agent, or Firm* — Dorsey & Whitney LLP

(57) ABSTRACT

Apparatuses including test segment circuits and methods for testing the same are disclosed. An example apparatus includes a plurality of segment lines configured to form a ring around a die and a plurality of test segment circuits, each test segment circuit coupled to at least two segment lines of the plurality of segment lines. Each test segment circuit is coupled to a portion of a first signal line, a portion of a second signal line, and a portion of a third signal line and each test segment circuit is configured to control an operation performed on at least one segment line of the plurality of segment lines.

10 Claims, 31 Drawing Sheets

APPARATUSES INCLUDING TEST SEGMENT CIRCUITS HAVING LATCH CIRCUITS FOR TESTING A SEMICONDUCTOR DIE

BACKGROUND

Integrated circuits are typically fabricated on semiconductor materials and are created using semiconductor manufacturing processes. During the manufacturing processes, several of the same integrated circuits are formed on wafers of semiconductor materials concurrently, and are then separated into individual semiconductor dies. Each of the dies represents a separate semiconductor device, which may be separately packaged and included in a larger electronic system. Examples of semiconductor devices include memory devices, multiprocessor devices, power semiconductor devices, and many others. With regards to memory devices, various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. As previously described, such memory devices can be produced as an integrated circuit on a semiconductor die. The semiconductor die may be sliced, cut, or "diced" from a wafer of semiconductor material on which the integrated circuit was fabricated.

During the "dicing" process or at other points in the semiconductor manufacturing process (e.g., during packaging of the die), forces on the die may produce cracks in the die. For example, a dicing operation may produce stress on a respective edge of two dies cut from a single wafer. Such stress may lead to a crack in the respective edge of one or both of those dies. Detecting cracks in a die can be a challenging process because many dies may be produced in a semiconductor manufacturing process, to which many stresses may be introduced. Visually inspecting the wafers for cracks in the die may be prohibitively slow and is not practical for large-scale production. Additionally, cracks in the die may not be visually apparent, for example, only apparent under stress, too small, along a line feature and not easily detectable, etc. Accordingly, a need exists for detecting cracks in a die that may be scaled to account for large-scale production of dies.

BRIEF DESCRIPTION OF THE DRAWINGS

FIG. 4A-4J is a timing diagram of various signals during a die testing operation according to an embodiment of the disclosure

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
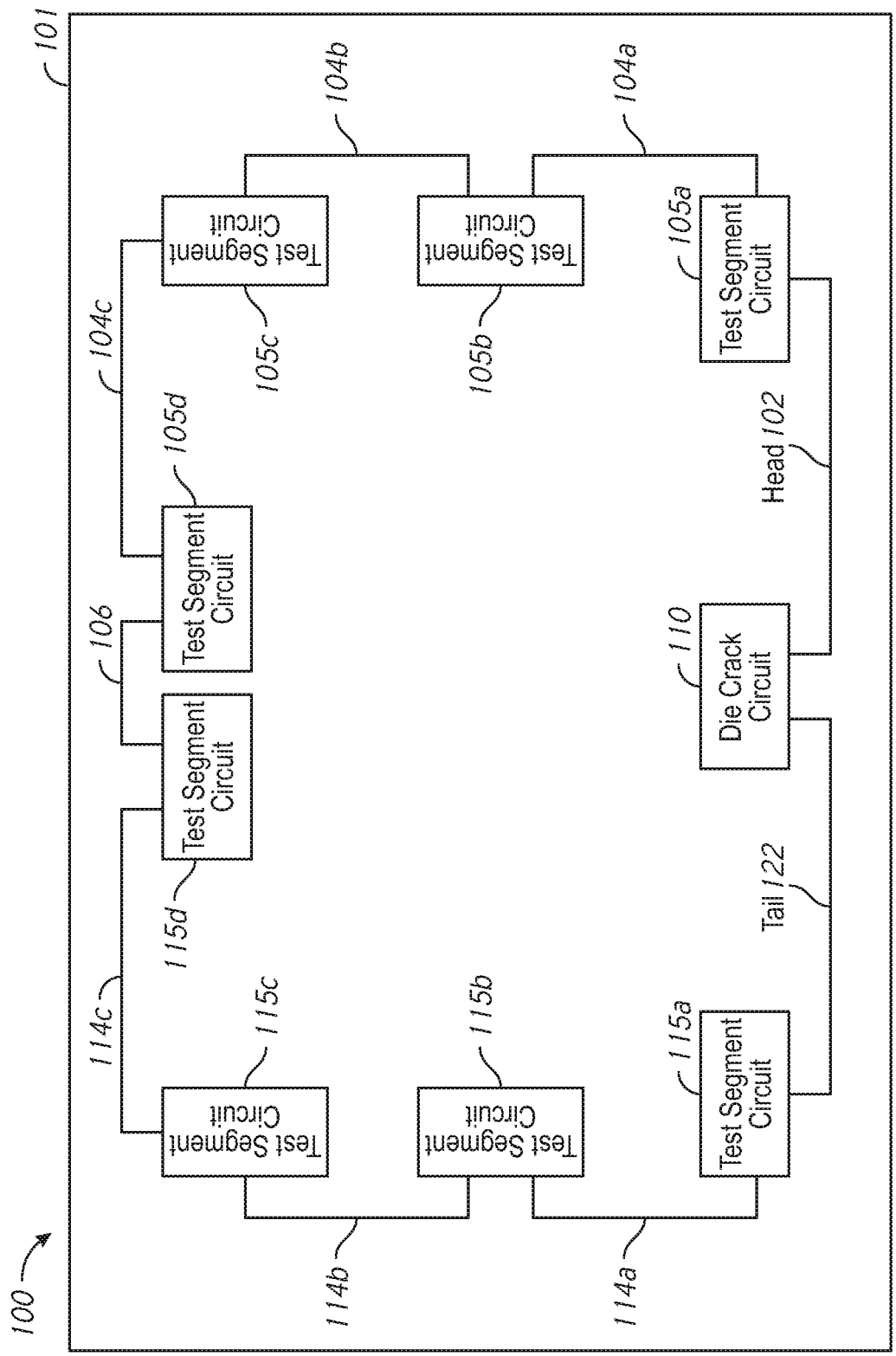
FIG. 1 is a block diagram of an example die layout in accordance with an embodiment of the disclosure.

FIG. 1 is a block diagram of an example die layout 100 in accordance with an embodiment of the disclosure from a top-view perspective. The die layout 100 includes a die 101 on which circuits may be fabricated. The die 101 includes test segment circuits 105a-d, 115a-d and die crack detection circuit 110. The die 101 also includes segment lines 102, 104a-c, 114a-c, and 122, between the test segment circuits 105a-d, 115a-d, that may be coupled via circuits of the die 101 such that the segment lines 102, 104a-c, 114a-c, 122 form a ring around the die 101. The die crack detection circuit 110 may be configured to test for die cracks by driving voltages to test segment circuits 105a-d, 115a-d along the segment lines 102, 104a-c, 114a-c, 122. One of the segment lines coupled to the die crack detection circuit 110 may be referred to as a head segment line 102 and another segment line coupled to the die crack detection circuit 110 may be referred to as a tail segment line 122. The test segment circuits 105a-d, 115a-d may be configured to control an operation performed on a segment line coupled to a respective test segment circuit 105a-d, 115a-d. For example, the test segment circuit 105a may control a test operation performed on the head segment line 102; the test segment circuit 105b may control a test operation on the head segment line 102 and the test segment line 104a; and so on, until a point 106 of the ring formed around the die 101. As used herein, the reference number 106 may reference the point 106, as well as a segment line including the point 106. For example, the point 106 and the segment line 106 may be used herein. The point 106 may be a midpoint of the die, that is, a midpoint of the segment lines. In some embodiments the point 106 may be located at other locations along the segment lines. In the example, the point 106 may be between test segment circuit 105d and test segment circuit 115d. In some embodiments, the point 106 may be a midpoint as measured from the die crack detection circuit 110 relative to the distance formed from a ring of the connecting segment lines 102, 104a-c, 114a-c, 122 around the die 101. In the example, the test segment circuits 115a-d after the point 106, as measured from the die crack detection circuit 110 along the head segment line 102, may be configured to control an operation on test segment lines 114a-c. For example, the test segment circuit 115d may control a test operation performed on the test segment lines 114a-114c and tail segment line 122; the test segment circuit 115c may control a test operation on the test segment lines 114a-114b and tail segment line 122; and so on, until the test segment circuit 115a is controlling a test operation on the tail segment line 122.

With test segment circuits 105a-105d, 115a-115d formed along each edge of the die 101 coupled via the segment lines 102, 104a-c, 114a-c, 122, die cracks may be detected along each edge of the die 101. Such horizontal segmentation across the edges of the die 101 may allow more efficient testing of die cracks and more accurately identify the location of any die cracks that are found. With increased accuracy of the location of a crack, scribe features used in forming and characterizing the circuits of the die may be analyzed at a corresponding location to determine if the scribe feature is the cause of the die cracks being formed. Once the cause has been determined, the scribe feature may be repaired or replaced. Such a process of detecting die cracks can avoid further die cracks from being caused in other dies using the same scribe feature. Accordingly, the die layout 100 may be utilized in dies to detect die cracks formed in the die 101, for example, die cracks generated when dicing through a specific scribe feature, by the manufacturing process of the die 101 (e.g., blade dicing, laser cutting, etching), or by some other irregularity in the die 101.

While eight segment lines 102, 104a-c, 114a-c, 122 that horizontally segment the edges of the die 101 are depicted in FIG. 1, it may be appreciated that the number of segment lines that horizontally segment the edges of the die 101 may vary. As utilized herein, a segment line may refer to a head segment line 102, test segment lines 104a-c, 114a-c, or tail segment line 122. It may be appreciated that any die horizontally segmented may include any number of segment lines: a head segment line, such as head segment line 102; a tail segment line, such as tail segment line 122; and multiple test segment lines, such as test segment lines 104a-c, 114a-c; for example, depending on a degree or a level of horizontal segmentation. The number of segment lines may depend on a target resistance to be measured at each segment line that can indicate whether a die crack is detected along that segment line. For example, the desired resistance of each segment line 102, 104a-c, 114a-c, 122 should be less than 1MΩ. In some embodiments of the disclosure, the range of the resistance is between 50-500 kΩ. The number of segment lines may also depend on the accuracy or precision with which a die crack is to be detected along a specific portion of the die 101. For example, utilizing additional test segment circuits on a die 101 coupled via additional segment lines, a location of the die crack may be detected more accurately or precisely. Each segment line 102, 104a-c, 114a-c, 122 may cover a smaller portion of the die 101 such that, during a testing operation of the die 101, a die crack may be detected to be along one of the segment lines 102, 104a-c, 114a-c, 122 or additional segment lines, as compared to a die layout 100 that utilizes the eight segment lines depicted. As an example, in some embodiments, the number of segment lines 102, 104a-c, 114a-c, 122 may vary based on a target resistance to be measured in each segment. As previously described, the desired resistance is less than 1MΩ. In some embodiments of the disclosure, the segment resistance is between 50-500 kΩ. Additionally or alternatively, the number of segment lines and die resistance may be expressed by Equation 1 and 2:

$$n_{segments} = \frac{Die_{Perimeter}}{S_{Length}} \quad (1)$$

$$Die_R = n_{segments} * S_R \quad (2)$$

Knowing $Die_{perimeter}$ and defining a desired $S_{Length}$ of a segment line, the number of segment lines, $n_{segments}$, may be determined according to Equation 1. $S_R$ may express the process resistance of a single segment line of length $S_{Length}$. $Die_R$ may be estimated with equation (2) which expresses the total resistance of a die (e.g., die 101) from a head node of the die crack circuit 110 at the head segment line 102 to a tail node of the die crack circuit 110 at the tail segment line 122. The number of test segment circuits (e.g., test segment circuits 105a-d, 115a-d) may equal the number of segment lines (e.g., segment lines 102, 104a-c, 114a-c, 122), for example, to provide for testing of each segment line, as described herein.

As will be apparent from the description below, the test operations of the test segment circuits may be utilized to control an operation on corresponding segment lines coupled to that test segment circuit. The test segment circuits may be operated in conjunction with the die crack detection circuit 110 to determine whether die cracks exist along the edges of the die 101. The components of a test segment circuit 105a-105d, 115a-115d and die crack detection circuit 110 may be made up of circuitry designed to carry out their functions. This may include various circuit elements, for example, conductive lines, transistors, capacitors, inductors, resistors, amplifiers, or other active or inactive elements, configured to carry out the functions described herein. An example embodiment, test segment circuits 105a-c and test segment circuits 115a-c are described herein with respect to FIG. 2A and FIG. 2B, respectively. An example embodiment of a die crack detection circuit 110 is described herein with respect to FIG. 3.

FIGS. 2A-2D are schematic diagrams 200, 250 illustrating the coupling of test segment circuits to signal lines of a die 201 according to an embodiment of the disclosure. In the example schematic diagrams 200, 250 of FIGS. 2A-2D, the signal lines of a die 201 are depicted from a cross-sectional view. Each signal line may correspond to a conductive path through one or more physical layers of the die 201. As depicted in FIGS. 2A-2D with diagonal shading and no shading, conductive paths may travel through various layers of the die 201. In the example depicted in FIG. 2A, the die 201 includes three signal lines, each signal line coupled to the test segment circuit 205 that is configured to control a test operation among segment lines of the die 201. For example, the test segment circuit 205 may control a test operation along head segment line 102 and test segment lines 104a-c, which may represent the segment lines up to a point 106 of the die 101 relative to the die crack detection circuit 110. In the example, the test segment circuit 205 may be coupled to a segment line of the die 201 via a portion of each of the signal lines described herein. In various embodiments, the test segment circuit 205 may correspond to any one of the test segment circuits 105a-d, and the die 201 may correspond to the die 101.

Figure 2A:
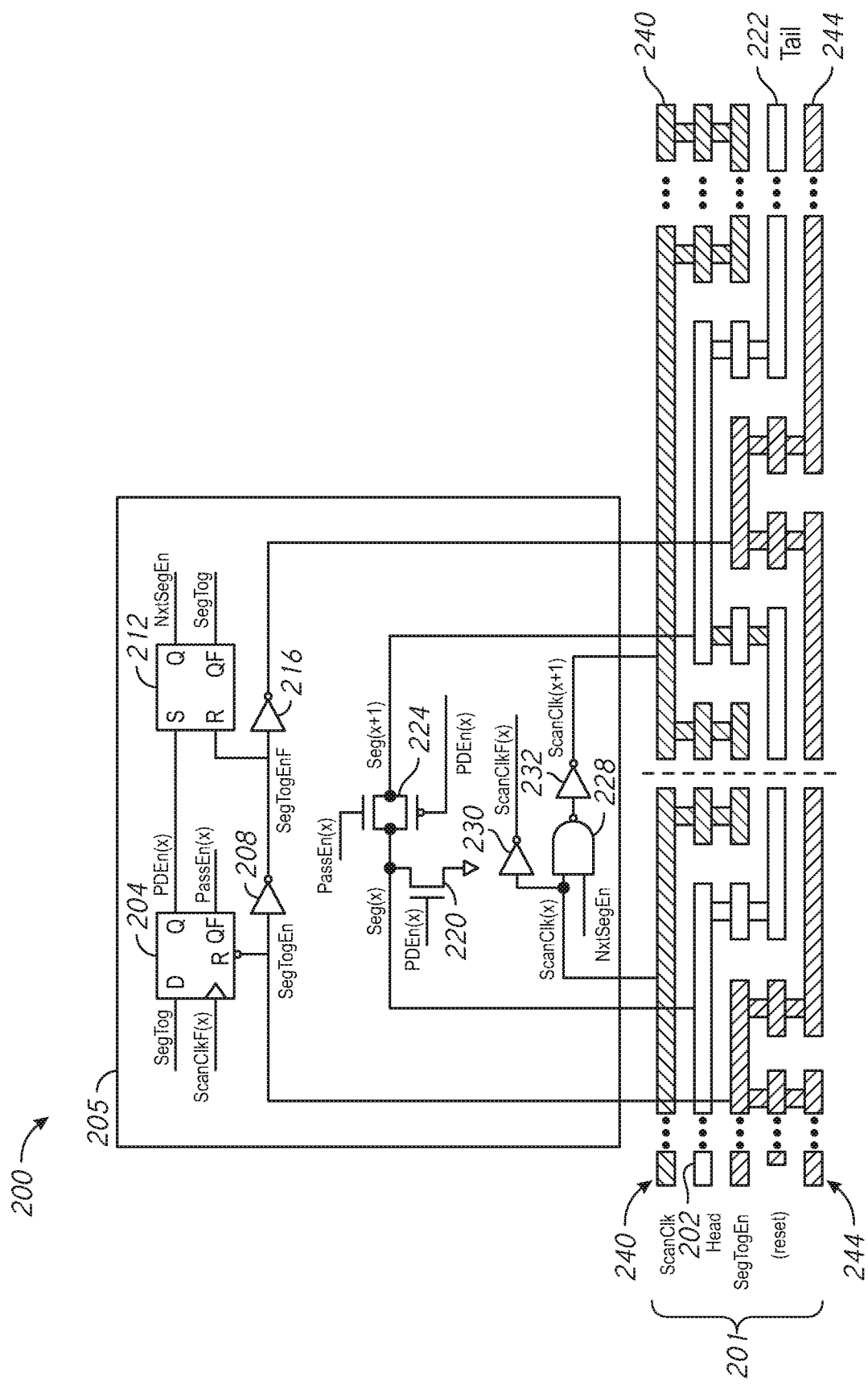
FIG. 2A-2D are schematic diagrams illustrating the coupling of test segment circuits to signal lines of a die according to an embodiment of the disclosure.

As described herein, operations may be performed via one or more segment lines of the die 201 to detect die cracks in the die 201. In the example of FIG. 2A, the test segment circuit 205 may be coupled to a segment line of the die 201 that, together with other segment lines of the die 201, form a ring around the die 201. For example, the test segment circuit 205 may be the test segment circuit 105d that is coupled to the segment line 104c. Continuing in the example of head segment line 102 and segment lines 104a-c, the test segment circuit 105c, implemented as test segment circuit 205, may control a test operation on three segment lines by activating the transistor 220 and deactivating the switch 224, with the die crack circuit 110 driving a voltage at a head node of the head segment line 102. In such an example, the segment lines preceding (e.g., as viewed from a head segment line 102) the coupling to the test segment circuit 205 (105b) may be tested for an open circuit, which would indicate a die crack in the die 201. As will be described in more detail below, in some embodiments of the disclosure, the open circuit testing may be combined with short circuit testing of the segment lines in the direction of the tail segment line. The short circuit testing may also be used to identify a die crack in the die.

The test segment circuit 205 is coupled to the signal lines of the die 201. From one perspective, each test segment circuit 205 of a die 201 may couple various segment lines of a die 201 at breakout points. Using the example of implementing test segment circuit 105b as test segment circuit 205, some components of the test segment circuit 205 (105b) may be coupled via respective portions of the segment line 104a, while other components of the test segment circuit 205 may be coupled via respective portions of the segment line 104b. The ScanClk signal line 240 is coupled to an input of a NAND gate 228 and an output of an inverter 232 of the test segment circuit 205. The ScanClk signal line 240 is also coupled to an inverter 230 that provides a ScanClkF(x) signal to the test segment circuit 205 based on a ScanClk(x) signal provided by the ScanClk signal line 240. As used herein, the 'F' notation subsequent to a signal name indicates that such signal is complementary to the logical value of the signal without that notation. In the example, the ScanClk(x) signal may be '1V' and the ScanClkF(x) signal may be '0V'. In the example of test segment circuit 105b, the NAND gate 228 is coupled to a portion of the segment line 104a, and the inverter 232 is coupled to a portion of the segment line 104b. The ScanClk signal may be a clock signal that clocks the test segment circuit 205 in operation. The ScanClk signal may be a clock signal (e.g., ScanClk(x)) that originates from an external system (e.g., tester circuit), or an internal system where that clock signal may be generated. For example, the ScanClk signal may be generated internally, when a test mode of the die 101 is activated. In such a test mode, the ScanClk signal is received at the ScanClk signal line 240 from the internal or external system that generated a clock signal to provide as the ScanClk signal.

The die 201 also includes a signal line that includes both a head portion 202 of the signal line and a tail portion 222 of the signal line. The signal line with the head portion 202 and the tail portion 222 is coupled to the test segment circuit 205. The signal line with the head portion 202 and the tail portion 222 is to be coupled to a transistor 220 and a switch 224, respectively, both of which are included in the test circuit segment 205. In the example of test segment circuit 105b, the transistor 220 is coupled to a portion of the segment line 104a; and the switch 224 is coupled to a portion of the segment line 104b. As described herein, the head portion 202 or the tail portion 222 may be driven by circuits on the die 201 (e.g., die crack detection circuit 110) to detect die cracks in the die 201, in conjunction with the test segment circuit 205. A SegTogEn signal line 244 is coupled to a D latch circuit 204, an inverter 208, and an inverter 216 of the test segment circuit 205. In the example of test segment circuit 105b, the D latch circuit 204 is coupled to a portion of the segment line 104a, and the inverter 216 is coupled to a portion of the segment line 104b. A SegTogEn signal, carried on the SegTogEn signal line 244, may be an enable signal that enables testing of a segment line controlled by the test segment circuit 205 in operation. The SegTogEn signal may be a signal that is generated when a test mode is activated. For example, the SegTogEn signal may be generated at an external system, when a test mode of the die 101 is activated, such as when a voltage is driven at the die crack circuit 110. The SegTogEn signal is received at the SegTogEn signal line 244 from the external system that generated a signal to provide as the SegTogEn signal. As may be appreciated from this description, the head portion 202 may be coupled to a head segment line 102; and the tail portion 222 may be coupled to a tail segment line 122.

The D-latch circuit 204 of the test segment circuit 205 receives as input and output various signals related to controlling a test operation on the die 201. The D latch circuit 204 may receive a SegTog signal that indicates the test segment circuit 205 is to include a segment line of the die 201 in a test operation, the segment line being coupled to the test segment circuit 205 in a test operation. In embodiments described herein of test operations, the SegTog signal of the test segment circuit 205 may be set to a high logical level (e.g., 1V) prior to a test operation, such that when an edge of a clock signal is received at the D latch circuit 204 the high logical level is latched by the D latch circuit 204. In the example of the test segment circuit 205, the D latch circuit 204 receives a ScanClkF(x) signal, a clock signal that clocks a test operation controlled, in part, by the test segment circuit 205. The D latch circuit 204 may also receive the SegTogEn signal, which may enable the test segment circuit 205 to test at least one segment line coupled thereto. The D latch circuit 204 may output a PDEn(x) signal to another latch circuit of test segment circuit 205, such as SR latch circuit 212. The D latch circuit 204 may also output a PassEn(x) signal to another component of the test segment circuit 205, such as the switch 224. While described in terms of a D latch circuit 204, it may be appreciated that any combination of circuitry or latch circuits that receives and sends the signals described herein to control a test operation may be utilized to perform the functionality of the D latch circuit 204.

The SR latch circuit 212 of the test segment circuit 205 receives as input and output various signals related to controlling a test operation on the die 201. The SR latch circuit 212 may receive a PDEn(x) signal, which may activate the transistor 220, that activates a pull-down mode in the test segment circuit 205. The SR latch circuit 212 may also receive a SegTogEnF signal that may provide a reset signal for the SR latch circuit 212. As the SegTogEn signal is set to a high logical value for the duration of a test operation, the SegTogEnF signal may be set to a low logical value for the duration of a test operation. Together, the PDEn(x) and SegTogEnF signal may control operation of the SR latch circuit 212, such that the SR latch circuit outputs the NxtSegEn signal at the end of a pull-down mode of the test segment circuit 205. For example, when the PDEn(x) rises to a high logical value, the NxtSegEn may be set to a high logical value by the SR latch circuit 212, which passes the high logical value to the Q output when the SegTogEnF signal remains at a low logical value. As described herein, the NxtSegEn signal may be received by the NAND gate 228, which, in conjunction with the inverter 232, passes a clock signal (e.g., ScanClk(x)) to an adjacent segment line or an adjacent test segment circuit as a clock signal (e.g., ScanClk(x+1)) via the ScanClk signal line 240. The SR latch circuit 212 may also output a SegTog signal at the QF output of the SR latch circuit 212. The SegTog signal may be received at the same node as input to the D latch circuit 204, which may further change the state of the D latch circuit 204. For example, in embodiments described herein of test operations, the SegTog signal of the test segment circuit 205 may be set to a low logical level (e.g., 0V) by the SR latch circuit 212, such that when an edge of a clock signal is received at the D latch circuit 204 the low logical level is latched by the D latch circuit 204, thereby ending a pull-down mode of test segment circuit 205. While described in terms of a SR latch circuit 212, it may be appreciated that any combination of circuitry or latch circuits that receives and sends the signals described herein to control a test operation may be utilized to perform the functionality of the SR latch circuit 212.

Still referring to FIG. 2A, the transistor 220 may receive a PDEn(x) signal at a node of the transistor 220. In the example, the transistor 220 may be an n-type field effect transistor. In such an example, the transistor 220 receives the PDEn(x) signal at a gate node of the transistor. The PDEn(x) signal, when having a logical high value, enables a pull-down mode of the transistor 220 that "pulls" a first node of the transistor 220 "down" to a second node of the transistor 220. That is, the transistor 220 couples the first node and the second node together. In the example, when the pull-down mode of the transistor 220 is activated, the Seg(x) node couples to the voltage source node (depicted in FIG. 2A as the triangle of the transistor 220) of the transistor 220. In the example, the Seg(x) node may represent the total segment line resistance up to the test segment circuit 205 relative to a node at a die crack detection circuit, such as die crack detection circuit 110. As depicted, the Seg(x) node may represent a conductive path from the coupling point in the test segment circuit 205 to a head portion 202. As described herein, coupling the Seg(x) node to a driving source (e.g., die crack circuit 110 driving a voltage at a head node of the head segment line 102) may allow testing of the segment lines that precede the test segment circuit 205 relative to a head segment line (e.g., head segment line 102).

The switch 224 may include an n-type field effect transistor and a p-type field effect transistor coupled in parallel and receive the PassEn(x) and PDEn(x) signals that, in conjunction, may activate or deactivate the switch 224. In the example, the PassEn(x) signal may be '1V' and the PDEn(x) signal may be '0V'. Accordingly, a '0V' value received as PassEn(x) may switch off the switch 224 such that the switch does not couple Seg(x) node to the Seg(x+1) node. For example, a '0'V value received as a PassEn(x) signal at the switch 224 when the D latch circuit 204 outputs a PDEn(x) signal as '1V' from the Q output and a corresponding PassEn(x) signal as a '0V' from the QF output.

The ScanClk signal line 240 may correspond to a topmost metal layer of the die 201. The metal layer may be an aluminum layer, for example. The ScanClk signal line may represent a single conductive path (depicted as diagonally shaded) to propagate a signal around the die 201. Some signal lines of die 201 may span one or more layers of the die 201. Such spanning of one or more layers of the die may be referred to as vertical segmentation of the die. For example, the die is vertically segmented according to different signal lines described herein. With the die 201 vertically segmented according to signal lines, the signal lines form conductive paths within the die 201. The signal line with the head portion 202 and the tail portion 222 forms a single conductive path at which various segment lines of the die 201 are coupled to various test segment circuits, such as test segment circuit 205. The signal line with the head portion 202 and the tail portion 222 (depicted without shading) may include several layers of the die, which may be metal layers (e.g., Cu and/or Al layers). In the example, the SegTogEn signal line 244 (depicted as diagonally shaded) may include several layers of the die 201, which may be metal layers and a polysilicon layer that forms on the substrate of a die 201. As depicted, while the SegTogEn signal line 244 spans three layers, that signal line 244 may also carry the SegTogEn signal or another signal, such as a "reset" signal, which may reset some values at the test segment circuit 205 coupled to the SegTogEn signal line 244. As depicted, some intermediate connections between the layers of the die 201 may couple the layers to form a single conductive path for signal propagation on the SegTogEn signal line 244. In the example, the "reset" signal may be activated at a different layer than the SegTogEn signal, but both signals may propagate along the single conductive path. A "reset" signal may reset each D latch circuit 204 such that a latch value of the D latch circuit 204 is reset to a uniform value in each test segment circuit 205 (e.g., a '0' value). The inverted version SegTogEnF may also reset SR latch 212 to a uniform value in each test segment circuit 205 (e.g. a '0' value).

In operation, the test segment circuit 205 is initialized by an active SegTogEn signal received from the SegTogEn signal line 244. In the example of a test operation, the SegTogEn signal is received at the D latch circuit 204 that resets the D latch circuit 204. During a test operation, the SegTogEn signal may be received once, for example at the initialization of a test operation, at each test segment circuit 205 before any pull-down mode is activated at any test segment circuit 205. In the example, a "reset" signal may be propagated on the SegTogEn signal line 244 to reset each D latch circuit 204 of various test segment circuits 205, such as test segment circuits 105a-d of FIG. 1. At the beginning of a test operation, an end of the signal line including the head portion 202 may be driven to a specific voltage by a die crack detection circuit, such as die crack detection circuit 110. In the example of FIG. 1, the specific voltage may be a voltage that is detectable at the test segment circuit 105d relative to the head segment line 102, with segment lines 104a-c and head segment line 102 being measured. With each switch 224 of a test segment circuit 205 activated at the beginning of a test operation, the voltage driven along the signal line including the head portion 202 and the tail portion 222 may result in a current that is observed by the die crack detection circuit 110. The current observed by the die crack detection circuit 110 may be measured through, for example, a test pad coupled to the die crack detection circuit 110. A device tester (e.g., used during production testing) may be coupled to the test pad (e.g., through a test probe) to provide the voltage that is driven along the segment lines of the signal line and to also measure a current when providing the voltage. Driving a voltage along that signal line including the head portion 202 and the tail portion 222 and receiving and measuring the current at the die crack detection circuit 110 may allow testing of segment lines formed around a die 201 to detect die cracks.

The test segment circuit 205 is activated by inputs received at the D latch circuit 204. In the example, the D latch circuit 204 receives a SegTog signal and a ScanClkF(x) signal that activates the operation of the D latch circuit 204. For example, if an edge of the ScanClkF(x) signal is received at the D latch circuit 204, then the value at the SegTog signal is latched by the D latch circuit 204. Continuing in an example, if the SegTog signal includes a 1V square wave, which may represent a logical high value, the Q output of the D latch circuit 204 will latch to the 1V signal, thereby outputting a logical high value for the PDEn(x) signal. A logical high value for the PDEn(x) signal enables a pull down ("PD") mode for the test segment circuit 205 and output a logical low value for the PassEn(x) signal. The transistor 220 is activated that enables a pull down mode of the transistor 220 that "pulls" a first node of the transistor 220 "down" to a second node of the transistor 220. In the example, when the pull down mode of the transistor 220 is activated, the Seg(x) node, which includes the segment lines coupled to the head portion 202, couples to a head node of the die crack detection circuit 110. At the same time that the transistor 220 is activated, the switch 224 decouples the preceding segment lines relative to the test segment circuit 205 from the subsequent segment lines. For example, the preceding segment lines may be the segment lines coupled to the Seg(x) node; and the subsequent segment lines may be the segment lines coupled to the Seg(x+1) node. In effect, the activation of the pull-down mode at the transistor 220 and the decoupling of segment lines by the switch 224 may cause a short-circuit at the Seg(x) node, thereby allowing testing for an open circuit on the preceding segment lines coupled to the Seg(x) node. As previously described, and will also be described in more detail below, in some embodiments of the disclosure, the open circuit testing may be combined with short circuit testing of the segment lines in the direction of the tail segment line.

The testing for an open circuit (e.g., by applying a short-circuit among preceding segment lines) that occurs during the operation of the test segment circuit 205 may include measuring a current from the head node through to the Seg(x) node, which may depend on the total segment line resistance up to the test segment circuit 205 relative to a head node at a die crack detection circuit (e.g. a head node of the head segment line 102), such as die crack detection circuit 110. In some examples, each additional segment line may include a specific resistance that allows a comparison of the predicted current based on the various specific resistances to a measured current. As previously described, a device tester coupled to the die crack detection circuit 110, for example, through a test pad, may be used to provide the voltage driven through the segment lines and to also measure a current through the segment lines while the voltage is provided. The tester may further be capable to compare the predicted current and the measured current. If the predicted current substantially varies from the measured current, a crack may be detected in the die 201, which may indicate that a crack exists in one of the signal lines or between the signal lines. For example, a die crack may exist in the signal line including the head portion 202 and the tail portion 222, which caused an open circuit when a short circuit should have been measured with a corresponding predicted current. For example, if the measured current is substantially low during an open-circuit test on the Seg(x) node, a die crack is detected in the die 201.

Continuing in the operation of test segment circuit 205, a test operation, such as testing for an open circuit at the Seg(x) node, may be clocked by the ScanClk signal. In the example, the inverter 230 receives the ScanClk(x) signal from the ScanClk(x) signal line 240. The inverter 230 outputs an inverted clock signal, ScanClkF(x), which may activate the D latch circuit 204 when received. After testing for an open-circuit in the preceding segment lines to the Seg(x) node, the ScanClk(x+1) is output by the inverter 232 to the ScanClk(x) signal line 240, with the NAND gate 228 having received a logical high value for the NxtSegEn input. For example, the NAND gate 228 NxtSegEn input receives a logical high value when a pull-down mode in the test segment circuit is enabled with a logical high value for the PDEn(x) setting the Q output of the SR latch circuit 212 as a NxtSegEn signal. For example, the ScanClk(x+1) signal may be received at another test segment circuit 205, 265 as the ScanClk(x) signal for testing of another segment line of the die 201. As described herein, a testing sequence or a test operator may operate a test pad 330 (which will be discussed later with reference to FIG. 3) to control test operations on the die 201. The ScanClkF(x) signal is also received by the D latch circuit 204 which, in conjunction with the SegTog signal, activates the operation of the D latch circuit 204 such that a pull-down mode is enabled in the test segment circuit 205.

The signal lines depicted in FIG. 2A form conductive paths across one or more physical layers of the die 201. In various embodiments, the physical layers of the die 201 may include various metal layers, such as an aluminum layer, a copper layer, or a combined copper/aluminum layer. The bottom layer of the die 201 may correspond to a polysilicon layer. The layers of a die 201 may be formed of various semiconductor compounds and polysilicon layers that form the conductive paths, such as the ScanClk signal line 240, the signal line with the head portion 202 and the tail portion 222, and the SegTogEn signal line 244.

During the operation of test segment circuit 205, a test operation, such as testing for an open circuit, may detect a short circuit in between the signal lines. As noted, some signal lines of die 201, vertically segmented, may span one or more layers of the die 201. If the ScanClk signal malfunctions due to a short circuit between the ScanClk signal line 240 and the signal line with the head portion 202 and tail portion 222, a die crack may exist in the signal line including the head portion 202 and the tail portion 222, which caused the short circuit. For example, a short circuit may be detected during the test operation, if the ScanClk(x) signal malfunctions and any of the test segment circuits 105*a-d*, 115*a-d* malfunctions. For example, a test segment circuit 105*a-d*, 115*a-d* may fail to activate or deactivate a segment line to which it is coupled, indicating that the test segment circuit has malfunctioned, and thus a short circuit may exists between the ScanClk signal line 240 and the signal line with the head portion 202 and tail portion 222. As another example of a short circuit in between signal lines, while performing an open circuit operation on certain segment lines, a short circuit may be detected, when an open circuit should have been detected. As described herein, such a short circuit may indicate a die crack between the any of the horizontally segmented segment lines 102, 104-*c*, 106, 114-*c*, 122. However, it may also indicate that a die crack exists between the SegTogEn signal line 244 and the signal line with the head portion 202 and tail portion 222. For example, the SegTogEn signal line 244 may be activated during a test operation and thus short signal line with the head portion 202 and tail portion 222 if a die crack exists between the two signal lines. Such a die crack may be detected if any of the test segment circuits 105*a-d*, 115*a-d* malfunctions. For example, a test segment circuit 105*a-d*, 115*a-d* may fail to activate or deactivate a segment line to which it is coupled, indicating that the test segment circuit has malfunctioned, and thus a short circuit may exist between the SegTogEn signal line 244 and the signal line with the head portion 202 and tail portion 222.

Figure 2B:
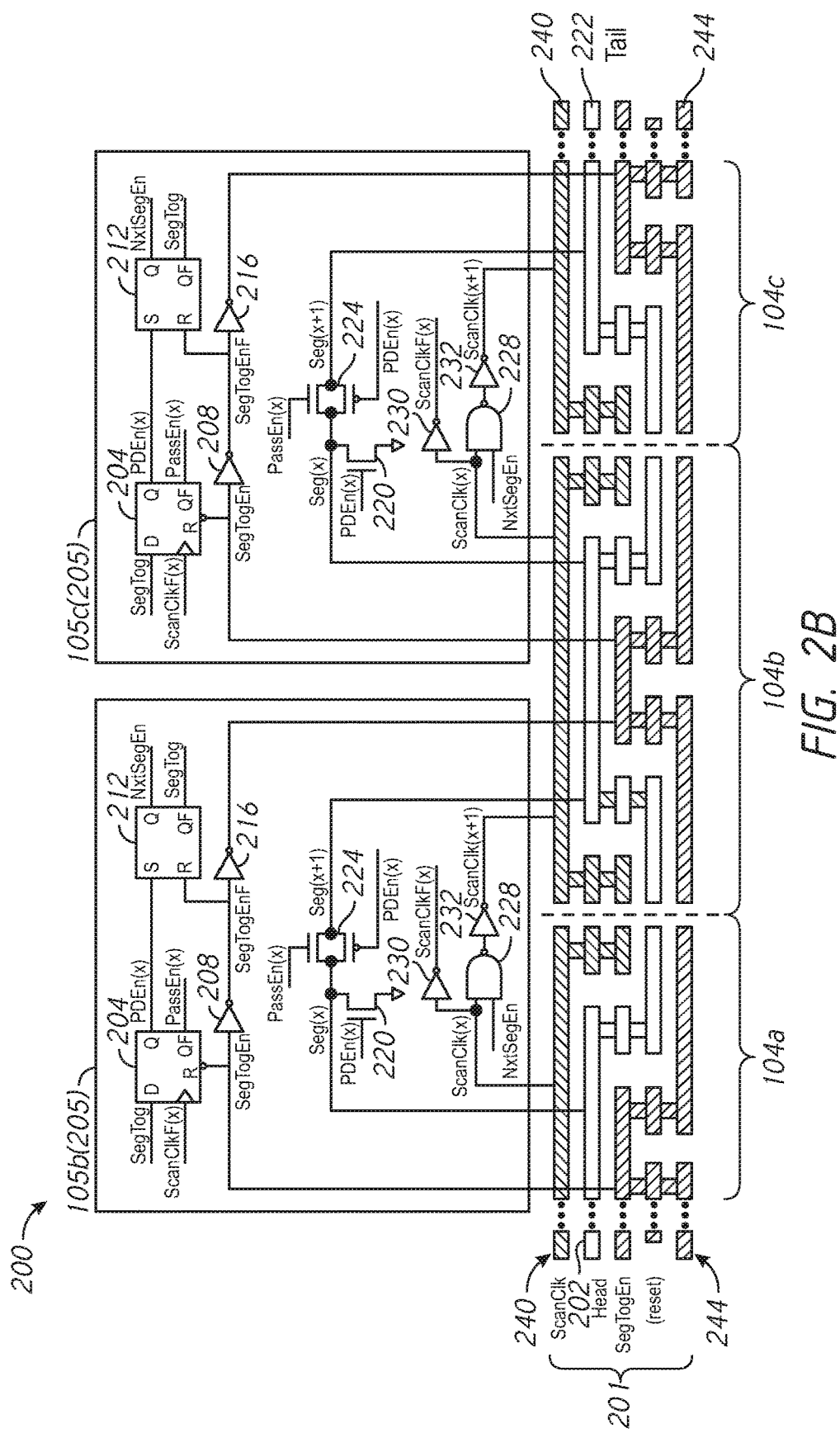

FIG. 2B is a schematic diagram 200 of the test segment circuit 205, implemented as part of the die layout 100, in accordance with an embodiment of the disclosure. In the example, the test segment circuits 105*b* and 105*c*, each implemented as test segment circuit 205, are coupled via the segment line 104b that includes the ScanClk signal line 240, the signal line with the head portion 202 and the tail portion 222, and the SegTogEn signal line 244. As depicted, the test segment circuit 105b, implemented as test segment circuit 205, is coupled to the segment line 104a and the segment line 104b, each, respectively, defining the Seg(x) and Seg (x+1) nodes of the test segment circuit 105b. In operation, the test segment circuits 105b and 105c may work in conjunction to perform a test operation on the die 101, which will be discussed later with reference to the timing diagram of FIG. 4.

Figure 2C:
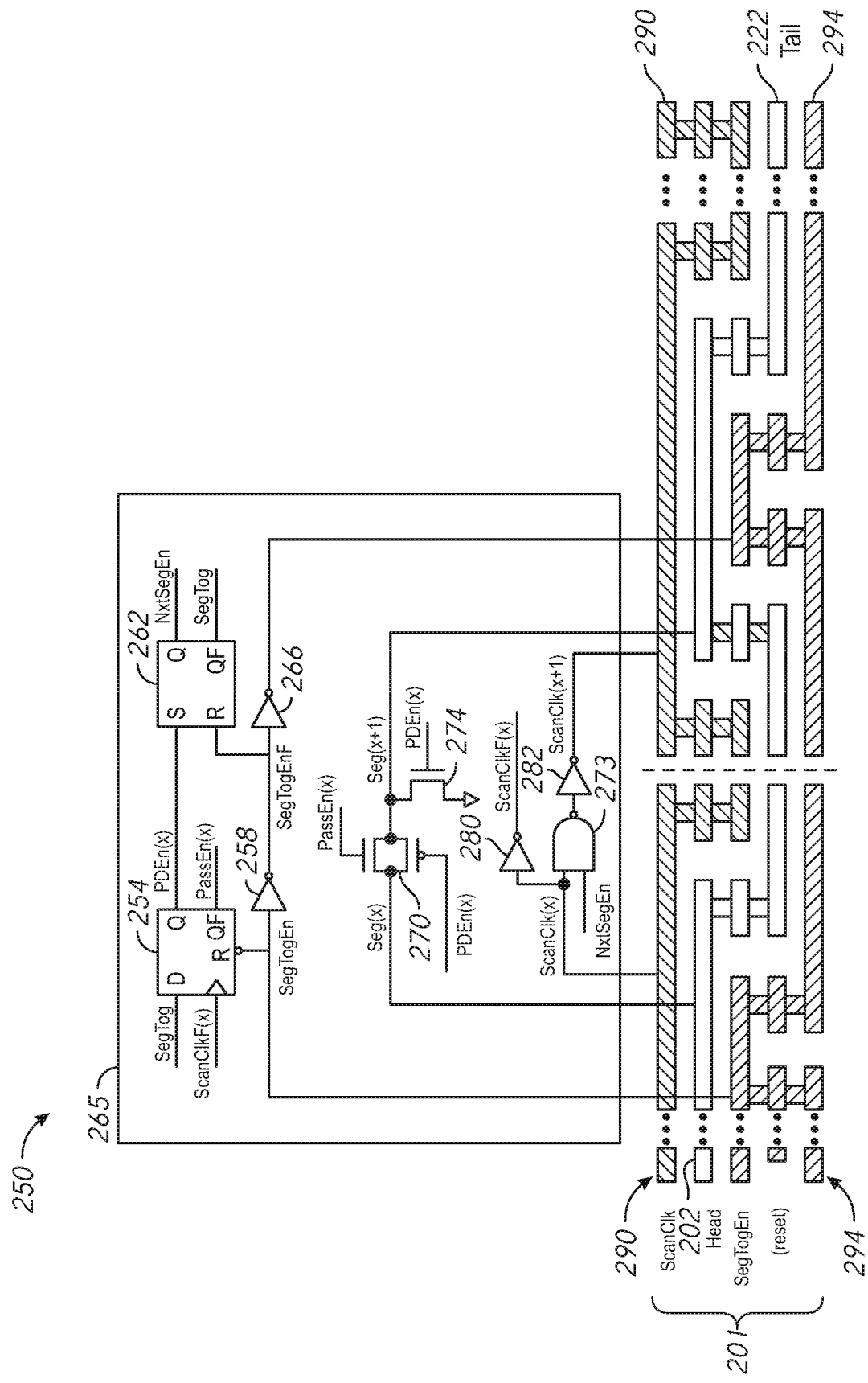

FIG. 2C is a schematic diagram 250 illustrating the coupling of a test segment circuit 265 to signal lines of a die 201 according to an embodiment of the disclosure. In the example schematic diagram of FIG. 2C, the signal lines of a die 201 are depicted from a cross-sectional view. The die 201 includes three signal lines, each signal line coupled to the test segment circuit 265 that is configured to control a test operation among segment lines of the die 201. For example, the test segment circuit 265 may control a test operation along any test segment line 114a-c and tail segment line 122, which may represent the segment lines up to a midpoint of the die 101 relative to the die crack detection circuit 110. In the example, the test segment circuit 265 may be coupled to a segment line of the die 201 via a portion of each of the signal lines described herein. In various embodiments, the test segment circuit 265 may correspond to any one of the test segment circuits 115a-d, and the die 201 may correspond to the die 101.

As described herein, operations may be performed via one or more segment lines of the die 201 to detect die cracks in the die 201. In the example of FIG. 2C, the test segment circuit 265 may be coupled to a segment line of the die 201 that, together with other segment lines of the die 201, form a ring around the die 201. For example, the test segment circuit 265 may be the test segment circuit 115d that is coupled to the segment line 114c. Continuing the example of tail segment line 102 and segment lines 114a-c, the test segment circuit 115d, implemented as the test segment circuit 265, may control a test operation on four segment lines by activating the transistor 274 and deactivating the switch 270, such that the segment lines subsequent to (e.g., as viewed from a head segment line 102) the coupling to the test segment circuit 265 may be tested for an open circuit, which would indicate a die crack in the die 201.

The test segment circuit 265 is coupled to the signal lines of the die 201. From one perspective, each test segment circuit 265 of a die 201 may couple various segment lines of a die 201 at breakout points. Using the example of implementing test segment circuit 115b as test segment circuit 265, some components of the test segment circuit 265 may be coupled via respective portions of the segment line 114a, while other components of the test segment circuit 265 may be coupled via respective portions of the segment line 114b. The ScanClk signal line 290 is coupled to an input of a NAND gate 273 and the output of an inverter 282 of the test segment circuit 265. The ScanClk signal line 290 is also coupled to an inverter 280 that provides a ScanClkF(x) signal to the test segment circuit 265 based on a ScanClk(x) signal provided by the ScanClk signal line 290. In the example, the ScanClk(x) signal may be '1V' and the ScanClkF(x) signal may be '0V'. In the example of test segment circuit 115b, the NAND gate 273 is coupled to a portion of the segment line 114b, and the inverter 282 is coupled to a portion of the segment line 114a. The ScanClk signal may be a clock signal (e.g., ScanClk(x) that clocks the test segment circuit 265 in operation.

The die 201 also includes a signal line that includes both a head portion 202 of the signal line and a tail portion 222 of the signal line. The signal line with the head portion 202 and the tail portion 222 is coupled to the test segment circuit 265. The signal line with the head portion 202 and the tail portion 222 is to be coupled to a transistor 274 and a switch 270, respectively, both of which are included in the test circuit segment 265. In the example of test segment circuit 115b, the transistor 274 is coupled to a portion of the segment line 114a, and the switch 270 is coupled to a portion of the segment line 114b. As described herein, the head portion 202 or the tail portion 222 may be driven by circuits on the die 201 (e.g., die crack detection circuit 110) to detect die cracks in the die 201, in conjunction with the test segment circuit 265. The SegTogEn signal line is coupled to a D latch circuit 254 and an inverter 258 followed by another inverter 266 of the test segment circuit 265. In the example of test segment circuit 115b, the D latch circuit 254 is coupled to a portion of the segment line 114b, and the inverter 266 is coupled to a portion of the segment line 114a. A SegTogEn signal, carried on the SegTogEn signal line 294, may be an enable signal that enables testing of a segment line controlled by the test segment circuit 265 in operation. As may be appreciated from this description, the head portion 202 may be coupled to a head segment line 102; and the tail portion 222 may be coupled to a tail segment line 122.

The D-latch circuit 254 of the test segment circuit 265 receives as input and output various signals related to controlling a test operation on the die 201. The D latch circuit 254 may receive a SegTog signal that indicates the test segment circuit 265 is to include a segment line of the die 201 in a test operation, the segment line being coupled to the test segment circuit 265 in a test operation. In embodiments described herein of test operations, the SegTog signal of the test segment circuit 265 may be set to a high logical level (e.g., 1V) prior to a test operation, such that when an edge of a clock signal is received at the D latch circuit 254 the high logical level is latched by the D latch circuit 254. In the example of the test segment circuit 265, the D latch circuit 254 may receive a ScanClkF(x) signal, a clock signal, that clocks a test operation controlled, in part, by the test segment circuit 265. The D latch circuit 254 may also receive the SegTogEn signal, which may enable the test segment circuit 265 to test at least one segment line coupled thereto. The D latch circuit 254 may output a PDEn(x) signal to another latch circuit of test segment circuit 265, such as the SR latch circuit 262. The D latch circuit 254 may also output a PassEn(x) signal to another component of the test segment circuit 265, such as the switch 270. While described in terms of a D latch circuit 254, it may be appreciated that any combination of circuitry or latch circuits that receives and sends the signals described herein to control a test operation may be utilized to perform the functionality of the D latch circuit 254.

The SR latch circuit 262 of the test segment circuit 265 receives as input and output various signals related to controlling a test operation on the die 201. The SR latch circuit 262 may receive a PDEn(x) signal, which may activate the transistor 274 or switch 270, that activates a pull-down mode in the test segment circuit 265. The SR latch circuit 262 may also receive a SegTogEnF signal that may provide a reset signal for the SR latch circuit 262. As the SegTogEn signal is set to a high logical value for the duration of a test operation, the SegTogEnF signal may be set to a low logical value for the duration of a test operation. Together, the PDEn(x) and SegTogEn signal may control operation of the SR latch circuit 262, such that the SR latch circuit outputs the NxtSegEn signal at the end of a pull-down mode of the test segment circuit 265. For example, when the PDEn(x) rises to a high logical value, the NxtSegEn may be set to a high logical value by the SR latch circuit 262, which passes the high logical value to the Q output when the SegTogEnF signal remains at a low logical value. As described herein, the NxtSegEn signal may be received by NAND gate 273, which, in conjunction with the inverter 282, passes a clock signal (e.g., ScanClk(x)) to an adjacent segment line or an adjacent test segment circuit via the ScanClk signal line 290. The SR latch circuit 262 may also output a SegTog signal at the QF output of the SR latch circuit 262. The SegTog signal may be received at the same node as input to the D latch circuit 254, which may further change the state of the D latch circuit 254. For example, in embodiments described herein of test operations, the SegTog signal of the test segment circuit 265 may be set to a low logical level (e.g., 0V) by the SR latch circuit 262, such that when an edge of a clock signal is received at the D latch circuit 254 the low logical level is latched by the D latch circuit 254, thereby ending a pull-down mode of test segment circuit 265. While described in terms of a SR latch circuit 262, it may be appreciated that any combination of circuitry or latch circuits that receives and sends the signals described herein to control a test operation may be utilized to perform the functionality of the SR latch circuit 262.

Still referring to FIG. 2C, the transistor 274 may receive a PDEn(x) signal at a node of the transistor 274. In the example, the transistor 274 may be an n-type field effect transistor. In such an example, the transistor 274 receives the PDEn(x) signal at a gate node of the transistor. The PDEn(x) signal, when having a logical high value, enables a pull-down mode of the transistor 274 that "pulls" a first node of the transistor 274 to a second node of the transistor 274. That is, the transistor 274 couples the first node and the second node together. In the example, when the pull-down mode of the transistor 274 is activated, the Seg(x+1) node couples to the voltage source node (depicted in FIG. 2C as the triangle of the transistor 274) of the transistor 274. In the example, the Seg(x+1) node may represent the total segment line resistance up to the test segment circuit 265 relative to a node at a die crack detection circuit, such as die crack detection circuit 110. As depicted, the Seg(x+1) node may represent a conductive path from the coupling point in the test segment circuit 265 to a tail portion 222. As described herein, coupling the Seg(x+1) node to a driving source (e.g., die crack circuit 110 driving a voltage at a tail node of the tail segment line 122) may allow testing of the segment lines that are subsequent to the test segment circuit 265 relative to a head segment line (e.g., head segment line 102).

The switch 270 receives the PassEn(x) and PDEn(x) signals that, in conjunction, may activate or deactivate the switch 270. In the example, the PassEn(x) signal may be '1V' and the PDEn(x) signal may be '0V'. Accordingly, a '0V' value received as PassEn(x) may switch off the switch 270 such that the switch does not couple Seg(x) node to the Seg(x) node. For example, a '0'V value received as a PassEn(x) signal at the switch 270 when the D latch circuit 254 outputs a PDEn(x) signal as a '1V' from the Q output and a corresponding PassEn(x) signal as '0V' from the QF output.

The ScanClk signal line 290 may correspond to a first metal layer of the die 201. The metal layer may be an aluminum layer, for example. The ScanClk signal line may represent a single conductive path (depicted as diagonally shaded) to propagate a signal around the die 201. Some signal lines of die 201 may span one or more layers of the die 201. The signal line with the head portion 202 and the tail portion 222 forms a single conductive path at which various segment lines of the die 201 are coupled to various test segment circuits, such as test segment circuit 265. The signal line with the head portion 202 and the tail portion 222 (depicted without shading) may include several layers of the die, which may be metal layers (e.g., Cu and/or Al layers). In the example, the SegTogEn signal line 294 (depicted as diagonally shaded) may include several layers of the die 201, which may be metal layers and a polysilicon layer that forms on the substrate of a die 201. As depicted, while the SegTogEn signal line 294 spans three layers, that signal line 294 may also carry the SegTogEn signal or another signal, such as a "reset" signal, which may reset some values at the test segment circuit 265 coupled to the SegTogEn signal line 294. As depicted, some intermediate connections between the layers of the die 201 may couple the layers to form a single conductive path for signal propagation on the SegTogEn signal line 294. In the example, the "reset" signal may be activated at a different layer than the SegTogEn signal, but both signals may propagate along the single conductive path. A "reset" signal may reset each D latch circuit 254 such that a latch value of the D latch circuit 254 is reset to a uniform value in each test segment circuit 265 (e.g., a '0' value).

In operation, the test segment circuit 265 is initialized by an active SegTogEn signal received from the SegTogEn signal line 294. In the example of a test operation, the SegTogEn signal is received at the D latch circuit 254 that resets the D latch circuit 254. During a test operation, the SegTogEn signal may be received once, for example at the initialization of a test operation, at each test segment circuit 265 before any pull-down mode is activated at any test segment circuit 265. In the example, a "reset" signal may be propagated on the SegTogEn signal line 294 to reset each D latch circuit 254 of various test segment circuits 265, such as test segment circuits 115a-d of FIG. 1. At the beginning of a test operation, an end of signal line including the tail portion 222 may be driven to a specific voltage by a die crack detection circuit, such as die crack detection circuit 110. In the example of FIG. 1, the specific voltage may be a voltage such that one can detect the current that flows when testing one or more segments of the ring between head 102 to tail 122, or conversely between tail 122 and head 102. With each switch 270 of a test segment circuit 265 activated at the beginning of a test operation, the voltage driven along the signal line including the head portion 202 and the tail portion 222 may result in a current that is received by the die crack detection circuit 110. The current received by the die crack detection circuit 110 may be measured by a device tester that is coupled to the die crack detection circuit 110 (e.g., through a test pad and a test probe). That is, the device tester provides the voltage that is driven along the segment lines of the signal line and measures a current when the voltage is provided. Driving a voltage along that signal line including the head portion 202 and the tail portion 222 and receiving and measuring the current at the die crack detection circuit 110 may allow testing of segment lines formed around a die 201 to detect die cracks.

The test segment circuit 265 is activated by inputs received at the D latch circuit 254. In the example, the D latch circuit 254 receives a SegTog signal and a ScanClkF(x) signal to activate the operation of the D latch circuit 254. For example, if an edge of the ScanClkF(x) signal is received at the D latch circuit 254, then the value at the SegTog signal is latched by the D latch circuit 254. Continuing in an example, if the SegTog signal includes a 1V square wave, which may represent a logical high value, the Q output of the D latch circuit 204 will latch to the 1V signal, thereby outputting a logical high value, the D latch circuit 254 will output a logical high value for the PDEn(x) signal. A logical high value for the PDEn(x) signal enables a pull down ("PD") mode for the test segment circuit 265 and output a logical low value for the PassEn(x) signal. The transistor 274 is activated that enables a pull down mode of the transistor 274 that "pulls" a first node of the transistor 274 "down" to a second node of the transistor 274. In the example, when the pull down mode of the transistor 274 is activated, the Seg(x+1) node, which includes the segment lines coupled to the tail portion 222, couples to a tail node of a die crack detection circuit 110. At the same time that the transistor 274 is activated, the switch 270 decouples the preceding segment lines relative to the test segment circuit 265 from the subsequent segment lines. For example, the preceding segment lines may be the segment lines coupled to the Seg(x) node; and the subsequent segment lines may be the segment lines coupled to the Seg(x+1) node. In effect, the activation of the pull-down mode at the transistor 274 and the decoupling of preceding segment lines by the switch 270 allows for an open-circuit test operation at the Seg(x+1) node. The open circuit testing may be combined with short circuit testing of the segment lines in the direction of the tail segment line in some embodiments of the disclosure, as previously described and will also be described in more detail below.

The testing for an open circuit (e.g., by applying a short-circuit among the subsequent segment lines) during the operation of the test segment circuit 265 may include measuring a current from the tail node through to Seg(x+1) node, which may depend on the total segment line resistance up to the test segment circuit 265 relative to a tail node at a die crack detection circuit (e.g. a tail node of the tail segment line 122), such as die crack detection circuit 110. In some examples, each additional segment line may include a specific resistance that allows a comparison of the predicted current based on the various specific resistances to a measured current. As previously described, a device tester coupled to the die crack detection circuit 110 (e.g., through a test pad), may be used to provide the voltage to the segment lines and to measure a current through the segment lines, and to further compare the predicted current and the measured current. If the predicted current substantially varies from the measured current, a crack may be detected in the die 201. For example, if the measured current is substantially low during an open-circuit test on the Seg(x+1) node, a die crack is detected in the die 201.

Continuing in the operation of test segment circuit 265, a test operation, such as testing for an open circuit at the Seg(x) node, may be clocked by the ScanClk signal. In the example, the inverter 280 receives the ScanClk(x) signal from the ScanClk(x) signal line 290. The inverter 280 outputs an inverted clock signal, ScanClkF(x), which may activate the D latch circuit 254 when received. After testing for an open-circuit, the ScanClk(x+1) is output by the inverter 282 to the ScanClk(x) signal line 290, with the NAND gate 273 having received a logical high value for the NxtSegEn input. For example, the NxtSegEn input receives a logical high value when a pull-down mode in the test segment circuit is enabled with a logical high value for the PDEn(x) setting the Q output of the SR latch circuit 262 as a NxtSegEn signal. For example, the ScanClk(x+1) signal may be received at another test segment circuit 265, through signal line 290 as the ScanClk(x) signal for testing of another segment line of the die 201. The ScanClkF(x) signal is also received by the D latch circuit 254 which, in conjunction with the SegTog signal, activates the operation of the D latch circuit 254 such that a pull-down mode is enabled in the test segment circuit 265.

Figure 2D:
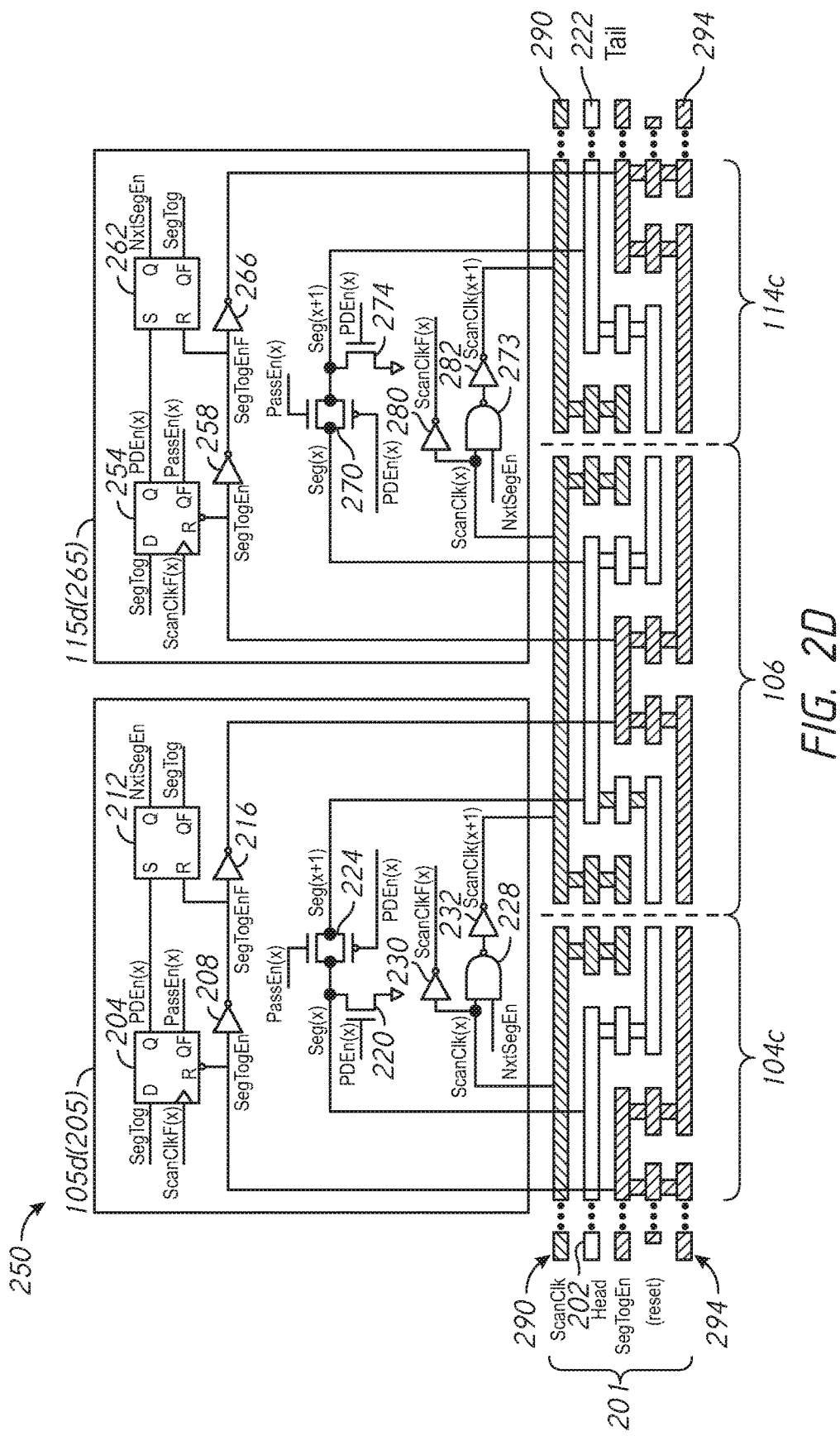

FIG. 2D is a schematic diagram 250 of the test segment circuit 265, implemented as part of the die layout 100, in accordance with an embodiment of the disclosure. In the example, the test segment circuits 105d and 115d, implemented as test segment circuit 205 and test segment circuit 265, respectively, are coupled via the point 106 that includes the ScanClk signal line 290, the signal line with the head portion 202 and the tail portion 222, and the SegTogEn signal line 294. As depicted, the test segment circuit 105d, implemented as test segment circuit 205, is coupled to the segment line 104c and the point 106, each, respectively, defining the Seg(x) and Seg(x+1) nodes of the test segment circuit 105d. The test segment circuit 115d, implemented as test segment circuit 265, is coupled to the point 106 and the segment line 114c, each, respectively, defining the Seg(x) and Seg(x+1) nodes of the test segment circuit 115d. In operation, the test segment circuits 105d and 115d may work in conjunction to perform a test operation on the die 101, which will be discussed later with reference to the timing diagram of FIG. 4.

Figure 3:
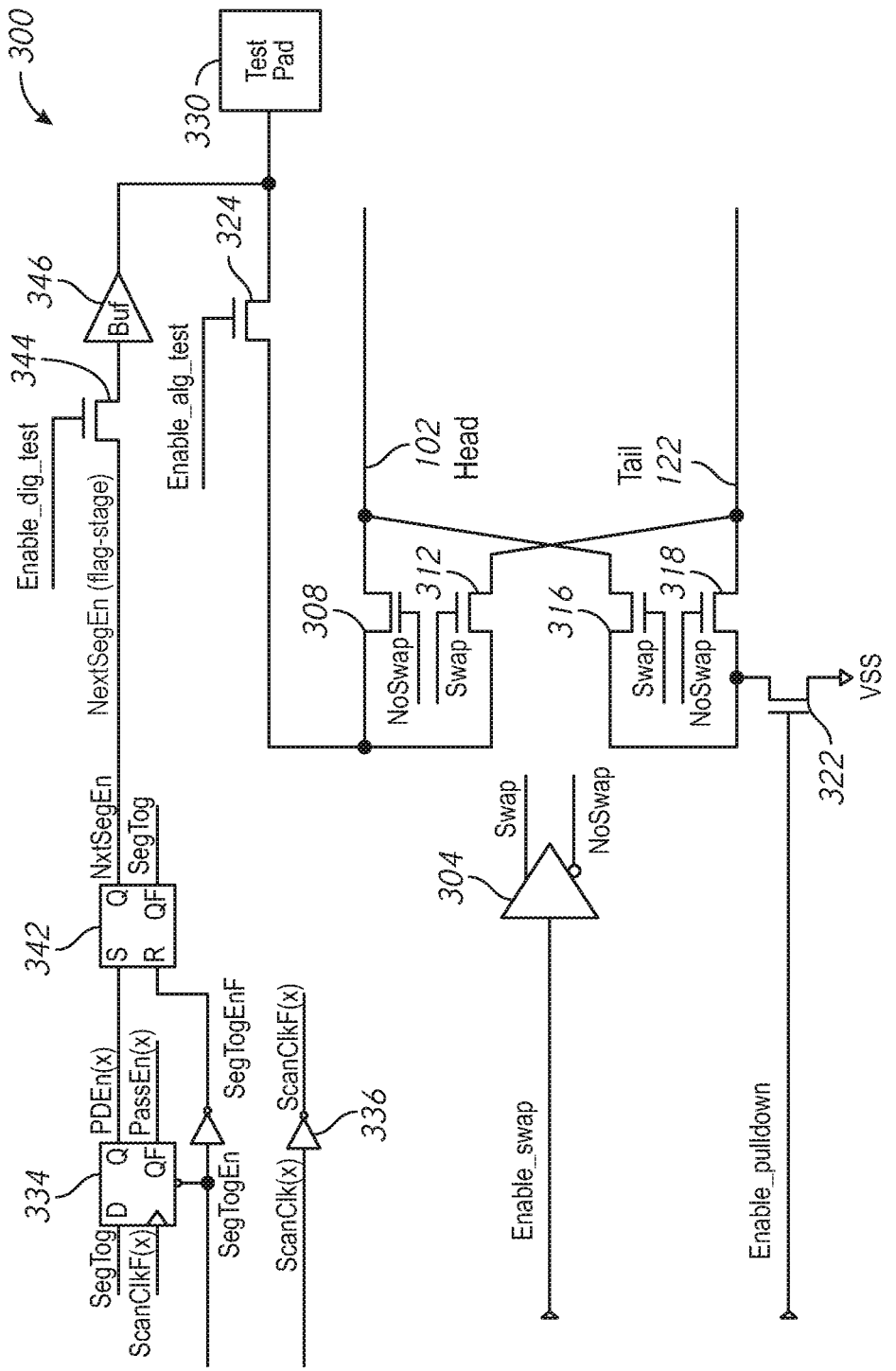
FIG. 3 is a schematic diagram of a die crack detection circuit according to an embodiment of the disclosure.

FIG. 3 is a schematic diagram 300 of a die crack detection circuit 110 according to an embodiment of the disclosure. The die crack detection circuit 110 includes a level shifter circuit 304 and switches 308, 312, 316, 318, 322. The die crack detection circuit 110 is coupled to an enable switch 324 and a test pad 330 via the enable switch 324. A test enable signal enable_swap is provided to the level shifter circuit 304 and a test enable signal enable_pulldown is provided to the switch 322. The level shifter circuit 304 provides the Swap and NoSwap signals based on the enable_swap signal. For example, the level shifter circuit 304 provides a Swap signal having the same logic level as the enable_swap signal and provides a NoSwap signal having a complementary logic level to the enable_swap signal. In some embodiments of the disclosure, the voltage levels of the Swap and NoSwap signals may be different than the voltage levels of the enable-swap signal, such as the Swap and NoSwap signals having higher voltages than the enable_swap signal for a high logic level. The switches 308, 312, 316, 318 are enabled to operate according to the Swap and NoSwap signals provided by the level shifter circuit 304. As previously described, the Swap and NoSwap signals are based on the enable_swap signal received for the die ring formed around a die, such as a die 101. The Swap and NoSwap signals determine whether the coupled head segment line 102 and coupled tail segment line 122 will drive voltages for test operations from a "head" node of head segment line 102 or operate a "tail" node of the tail segment line 122, respectively. In the example, an active NoSwap signal (e.g., active high logic level) activates the switches 308, 318; and consequently, the switches 312, 316 are deactivated having received an inactive Swap signal. Accordingly, the tail segment line 122 is coupled to the switch 322 via the switch 318 for a test operation, and the head segment line 102 is coupled to the test pad 330 via the enable switch 324. Continuing in the example, an active Swap signal (e.g., active high logic level) activates the switches 312, 316; and consequently, the switches 308, 318 are deactivated having received in inactive NoSwap signal. Accordingly, the tail segment line 122 is coupled to the test pad 330 via the enable switch 324, and head segment line 102 is coupled to the switch 322 via the switch 316 for a test operation.

Also shown in FIG. 3, the die crack detection circuit 110 further includes D latch circuit 334 and SR latch circuit 342. The D latch circuit 334 receives the SegTogEn signal and the SR latch circuit 342 receives the SegTogEnF signal provided by the inverter circuit 338. The D latch circuit 334 further receives a SegTog signal and is clocked by the ScanClkF(x) signal. The ScanClkF(x) signal is provided by an inverter circuit 336, which receives a ScanClk(x) signal. When clocked by the ScanClkF(x) signal, the D latch circuit 334 latches the logic level of the SegTog signal and provides a PDEn(x) signal having the logic level of the SegTog signal, and further provides a PassEn(x) signal having the complementary logic level of the SegTog signal. The PDEn(x) signal is provided to the SR latch circuit 342. The SR latch circuit 342 is set responsive to the PDEn(x) signal and is reset responsive to the SegTogEnF signal. The SR latch circuit 342 provides a NxtSegEn signal and a SegTog signal, which are complementary to each other. The die crack detection circuit 110 further includes a buffer circuit 346 that receives the NxtSegEn signal through an enable switch 344. The enable switch 344 is activated by an active (e.g., high logic level) enable_dig_test control signal. As will be described in more detail below, the D latch circuit 334 and the SR latch circuit 342 are used to latch the state of the test segment circuit 115a. The enable switches 324 and 344 may be controlled to couple the test pad 330 to the output of the SR latch circuit 342 or to couple the test pad 330 through the switches 308, 312, 316, 318 to the head segment line 102 or tail segment line 122.

In the operation of a die crack detection circuit 110, as depicted in schematic diagram 300, test enable signals may be received to swap the point of test access (308, 312, 316, 318), open access via 324 to an external test pad 330, or enable a pull down switch 322. These test signals can be used to configure the circuit 110 to test the die before any ScanClks are issued to the device. The enable_alg_test signal is set to logic state "1" to enable external forced voltage from the test pad 330 through switch 324. Enabling external access allows voltage supplies with current measurement capability to be utilized during characterization of the circuit. Setting enable_alg_test to logic state "0" disables the switch 324 and disconnects the "head" node 102 or "tail" node 122 from the external test pad 330.

After enabling external access through the switch 324, the enable_swap signal controls which endpoint of the die crack detection circuit is connected to the external test pad 330. When enable_swap signal line is logic level "0", the NoSwap signal goes to logic level "1" which enables switch 308 and 318 while the Swap signal goes to logic level "0" which disables switch 316 and 312. The combination of switches being enabled and disabled with enable_swap signal being logic level "0" results in test pad 330 connecting to the "head" node of head segment line 102 while the "tail" node of the tail segment line 122 is connected to the pulldown device 322. Conversely, if enable_swap signal is set to logic level "1", the logic states of Swap and NoSwap signals are inverted and the "tail" node of segment line 122 is connected to the test pad 330 while the "head" node of segment 102 is connected to the pulldown device 322.

Further describing FIG. 3, when the enable_pulldown signal is enabled to logic level "1" switch 322 is enabled which connects the "tail" or "head" node to a known voltage level. In the embodiment shown in FIG. 3, the switch 322 is coupled to a VSS supply level. In other embodiments of the disclosure, the switch 322 may be coupled to another voltage, for example, VCC, or another voltage supply, or a variable voltage supply level. The switch 322 may be used during the testable die ring initial state (e.g., SegTogEn is a high logic level, and inactive ScanClk).

One additional or alternative method by which die crack circuit 110 could be utilized to test for open circuits is by setting enable swap to logic level "0" with enable_pulldown and enable_alg_test signals set to logic level "1" to enable the pulldown device 322 and switch 324 while applying a known test voltage to the test pad 330 and monitoring the current that flows into the test pad 330. If the current measured flowing into the test pad 330 is lower than expected, this might signify an open circuit. If the current measured is found to be acceptable, the enable_swap logic level could be shifted to "1" toggling the direction which the current would flow in the circuit. The current measured could again be compared to expected levels, with a lower relative current signifying a potential "open circuit".

In addition to testing for open circuits, the circuit 110 can be utilized to test for short circuits by keeping the above logic states as noted, and then toggling the enable_pulldown signal to a logic level "0", disabling the pulldown device 322. If the current seen flowing into the test pad 330 remained at a higher than expected level, this may signify a short somewhere in the circuit. As previously discussed, testing for open circuits and short circuits along the segment lines 102, 104a-104c, 106, 114a-114c and 122 using the die crack circuit 110 and the test segment circuits 105a-d and 115a-115d may be combined. Additional details on the die crack circuit 110 are described in later sections and in FIGS. 6A-6D.

FIG. 4A-4J are block diagrams showing an iterative testing process according to an embodiment of the disclosure. FIG. 5 is a timing diagram of various signals during an operation of the testing process of FIGS. 4A-4J. The testing process utilizes the ScanClk signal line 290 and the SegToGen signal line 294 and may provide information regarding the continuity of the ScanClk and SegTogEn signal lines 290 and 294 around the die.

Figure 4A:
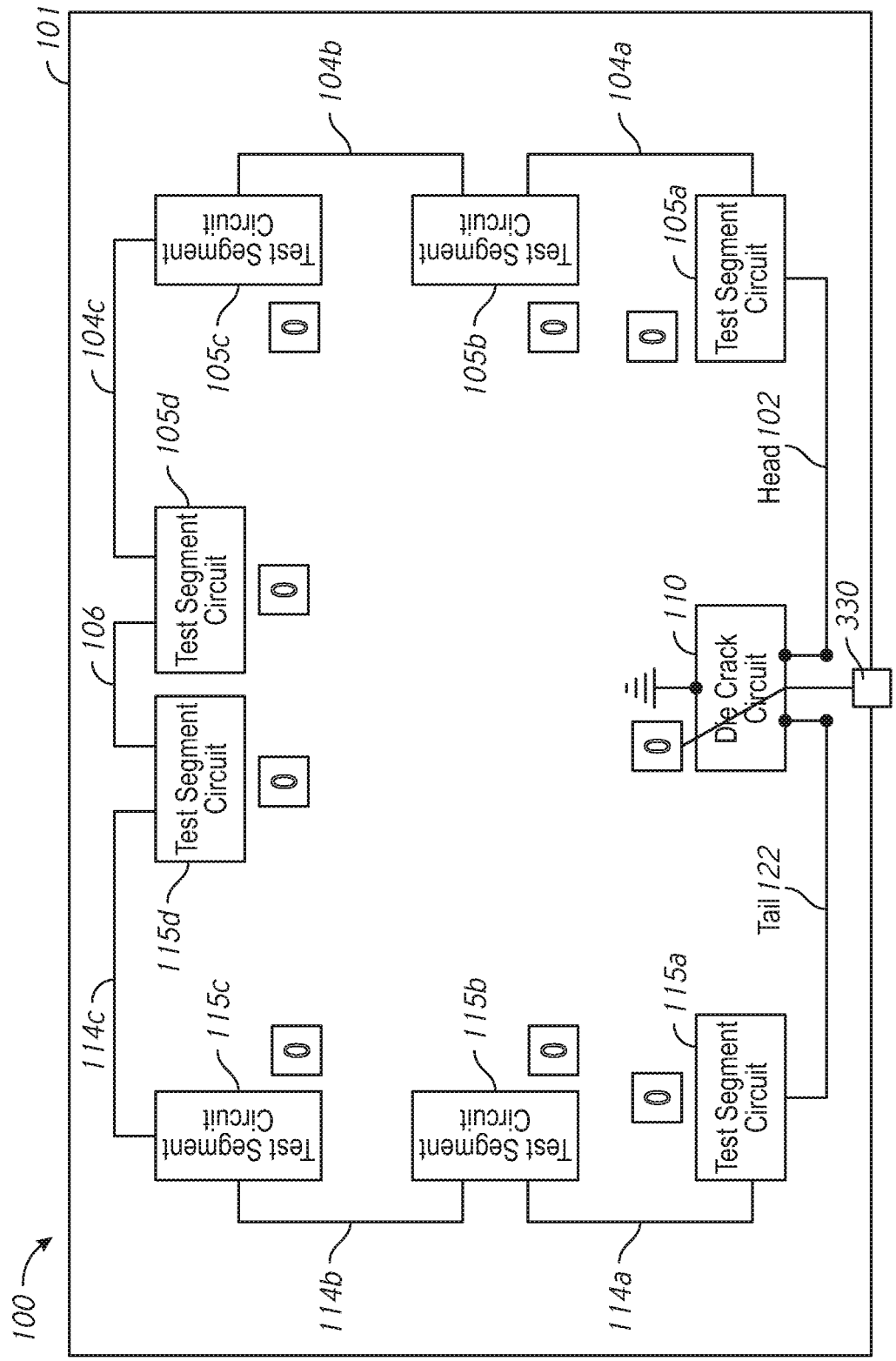
Figure 5:
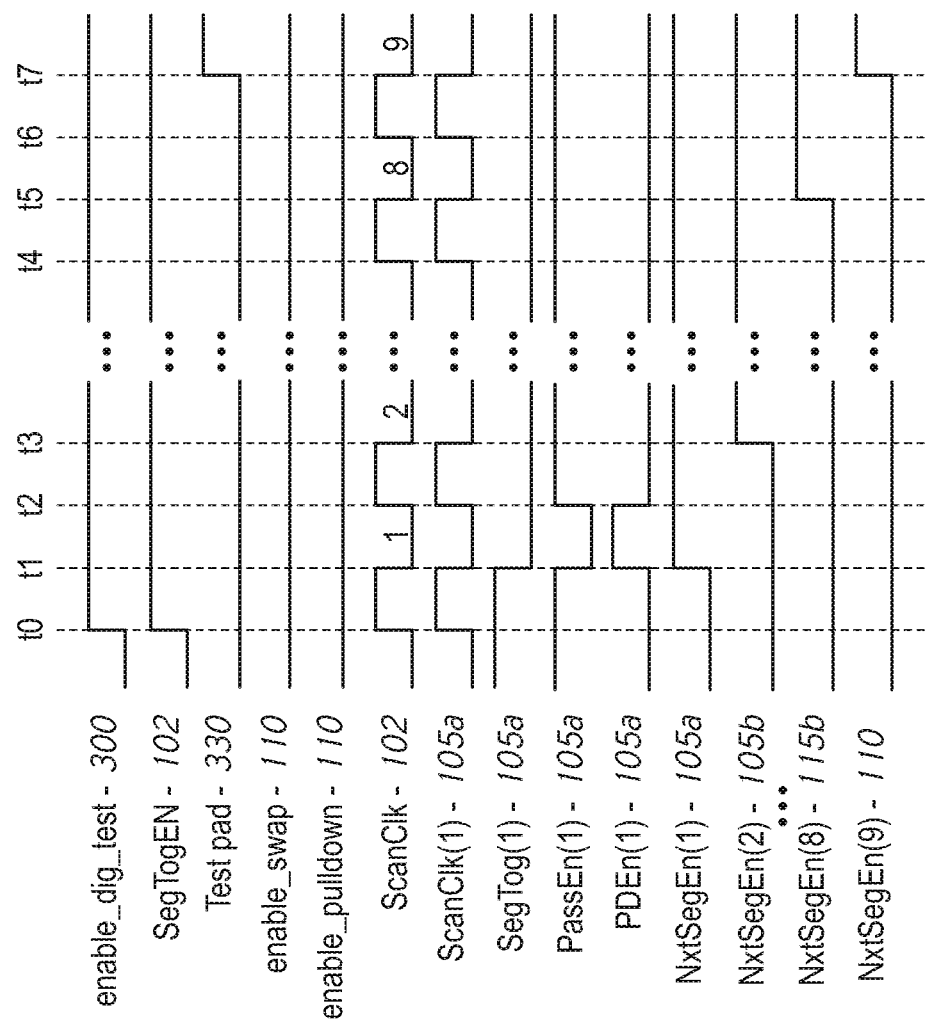
FIG. 5 is a flow diagram of an example method of testing a die for a die crack according to an embodiment of the disclosure.

Referencing FIGS. 4A and 5, prior to time t0, the SegTogEn signal is a low logic level, which causes the D latch circuits 204 and 254 of the test segment circuits 105a-d and 115a-115d to be deactivated and the SR latch circuits 212 and 262 to reset and provide a low logic level NxtSegEn(x) signal. The PassEn(x) signals are a high logic level and the PDEn(x) signals are a low logic level to provide a continuous conductive path that includes the segments lines between a head node of the head segment line 102 to a tail node of the tail segment line 122. Also prior to time t0 the enable_dig_test signal is low causing the enable switch 344 to be deactivated.

At time t0, the SegTogEn changes to a high logic level to enable testing with the continuous conductive path of segment lines, for example, the D latch circuits 204 and 254 are activated. The enable_dig_test signal also changes to a high logic level to activate the enable switch 344 so that an output of the SR latch circuit 342 of the die crack circuit 110 may be provided to the test pad 330. FIG. 4A shows the test pad 330 coupled to receive the output of the SR latch circuit 342 of the die crack circuit 110. FIG. 4A, as well as FIGS. 4B-4J, also show a representation of the logical output of the SR latch circuit 342 of the die crack circuit 110 and the SR latch circuits 212 and 262 of the test segment circuits 105a-105d and 115a-115d, which are all "0" at time t0.

Figure 4B:
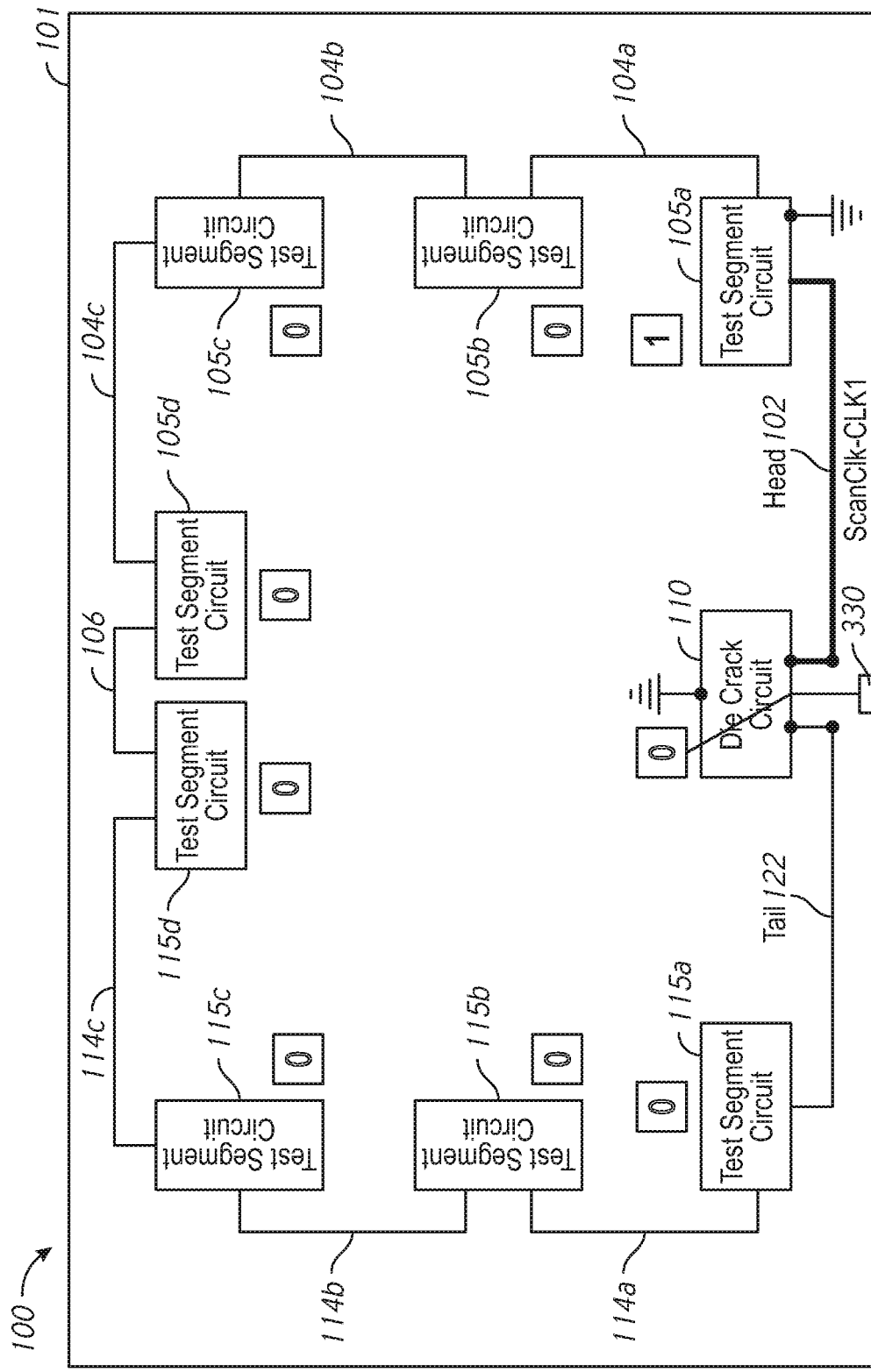

Also at time t0, the ScanClk signal is toggled, which is received by the test segment circuit 105a. At time t1, the ScanClk signal changes to a low clock level causing the D latch 204 of the test segment circuit 105a to latch the SegTog signal. As a result, the PassEn(x) signal changes to a low logic level and the PDEn(x) signal changes to a high logic level. With the PDEn(x) signal at a high logic level, the transistor 220 is activated to ground a tail node of the head segment line 102 and with the PassEn(x) signal at a low logic level the switch 224 is deactivated to decouple the head segment line 102 from the segment line 104a. Additionally, as provided by the SR latch circuit 212 of the test segment circuit 105a, the SegTog signal changes to a low logic level and the NxtSegEn signal changes to a high logic level. The high logic level NxtSegEn signal of the test segment circuit 105a is shown in FIG. 4B as the "1" adjacent the test segment circuit 105a. FIG. 4B generally represents the condition of the segment lines and the test segment circuits following the change in the ScanClk signal to a low clock level at time t1. The respective SR latch circuits of other test segment circuits and the die crack circuit 110 continue to have a "0" output, as shown in FIG. 4B. The "0" output of the SR latch circuit 342 of the die crack circuit 110 is provided to the test pad 330. A device tester coupled to the test pad 330 may read the "0" output from the die crack circuit 110, which is represented by a "0" for CLK1 in the table of FIG. 4B.

At time t2, the ScanClk signal is again toggled, which is received by the test segment circuit 105a, and due to the high logic level of the NxtSegEn signal of the test segment circuit 105a, the test segment circuit 105b also receives the toggled ScanClk signal. In response, the D latch 204 of the test segment circuit 105a latches the low logic level SegTog to provide a high logic level PassEn(x) signal and a low logic level PDEn(x) signal. As a result, the transistor 220 of the test segment circuit 105a is deactivated and the switch 224 of the test segment circuit 105a is activated to provide a conductive path that includes the head segment line 102 and the segment line 104a.

Figure 4C:
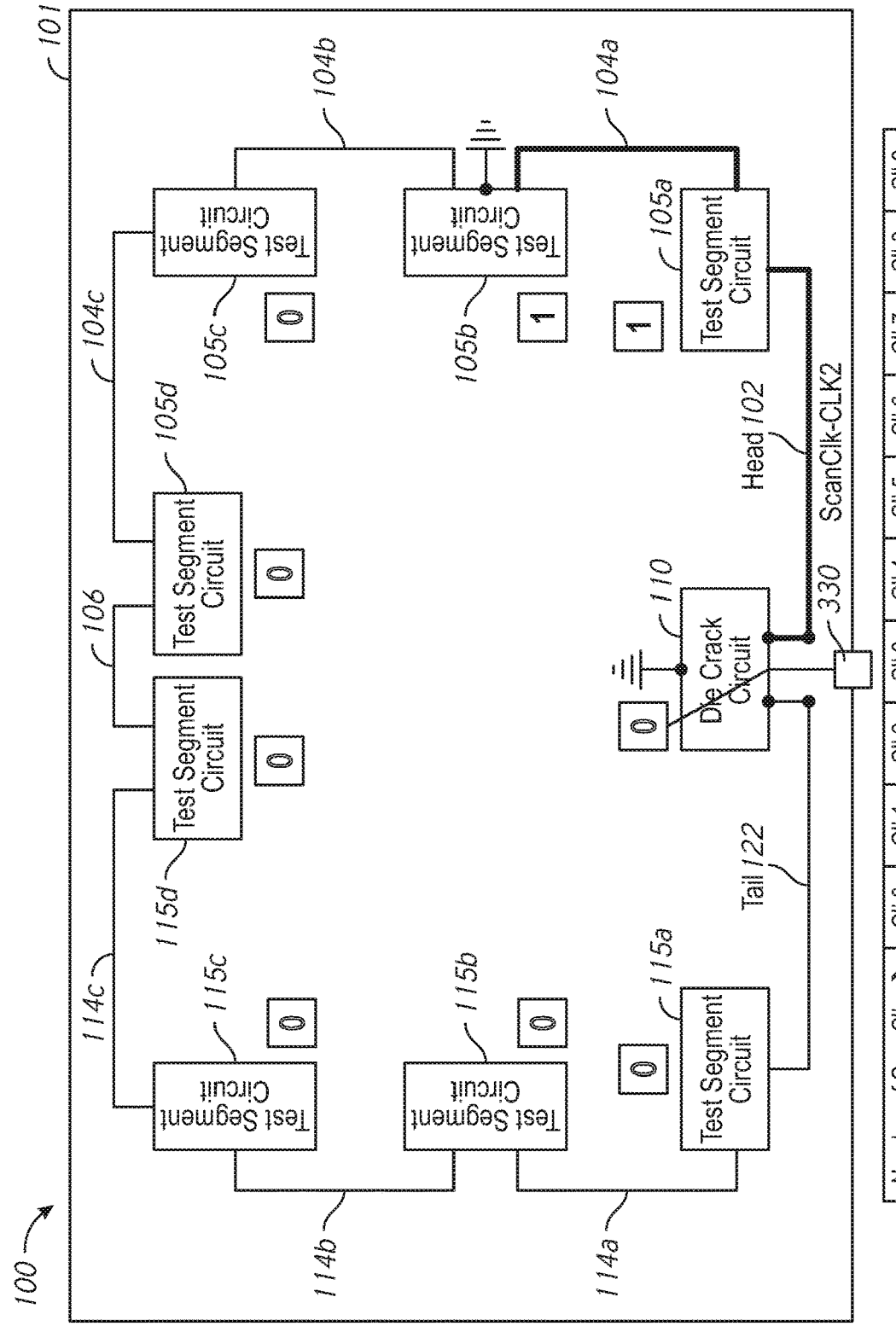

At time t3, the ScanClk signal changes to a low clock level. In response to the low logic level ScanClk signal, the D latch 204 of the test segment circuit 105b latches the SegTog signal. As a result, the PassEn(x) signal changes to a low logic level and the PDEn(x) signal changes to a high logic level. With the PDEn(x) signal at a high logic level, the transistor 220 of the test segment circuit 105b is activated to ground a tail node of the segment line 104a and with the PassEn(x) signal at a low logic level the switch 224 is deactivated to decouple the segment line 104a from the segment line 104b. Additionally, as provided by the SR latch circuit 212 of the test segment circuit 105b, the SegTog signal changes to a low logic level and the NxtSegEn signal changes to a high logic level. The high logic level NxtSegEn signal of the test segment circuit 105a is shown in FIG. 4C as the "1" adjacent the test segment circuit 105b. Thus, following time t3, the NxtSegEn signals provided by both the respective SR latch circuit 212 of the test segment circuits 105a and 105b are at the high logic level. FIG. 4C generally represents the condition of the segment lines and the test segment circuits following the change in the ScanClk signal to a low clock level at time t3. The respective SR latch circuits of other test segment circuits and the die crack circuit 110 continue to have a "0" output, as shown in FIG. 4C. The "0" output of the SR latch circuit 342 of the die crack circuit 110 is provided to the test pad 330. A device tester coupled to the test pad 330 may read the "0" output from the die crack circuit 110, which is represented by a "0" for CLK2 in the table of FIG. 4C.

FIGS. 4D-4H show the progression of the coupling of the segment lines 104c, 106, and 114a-114c, and the output of the respective SR latch circuits of the test segment circuits 105c, 105d, and 115b-115d due to toggling the ScanClk signal.

Figure 4D:
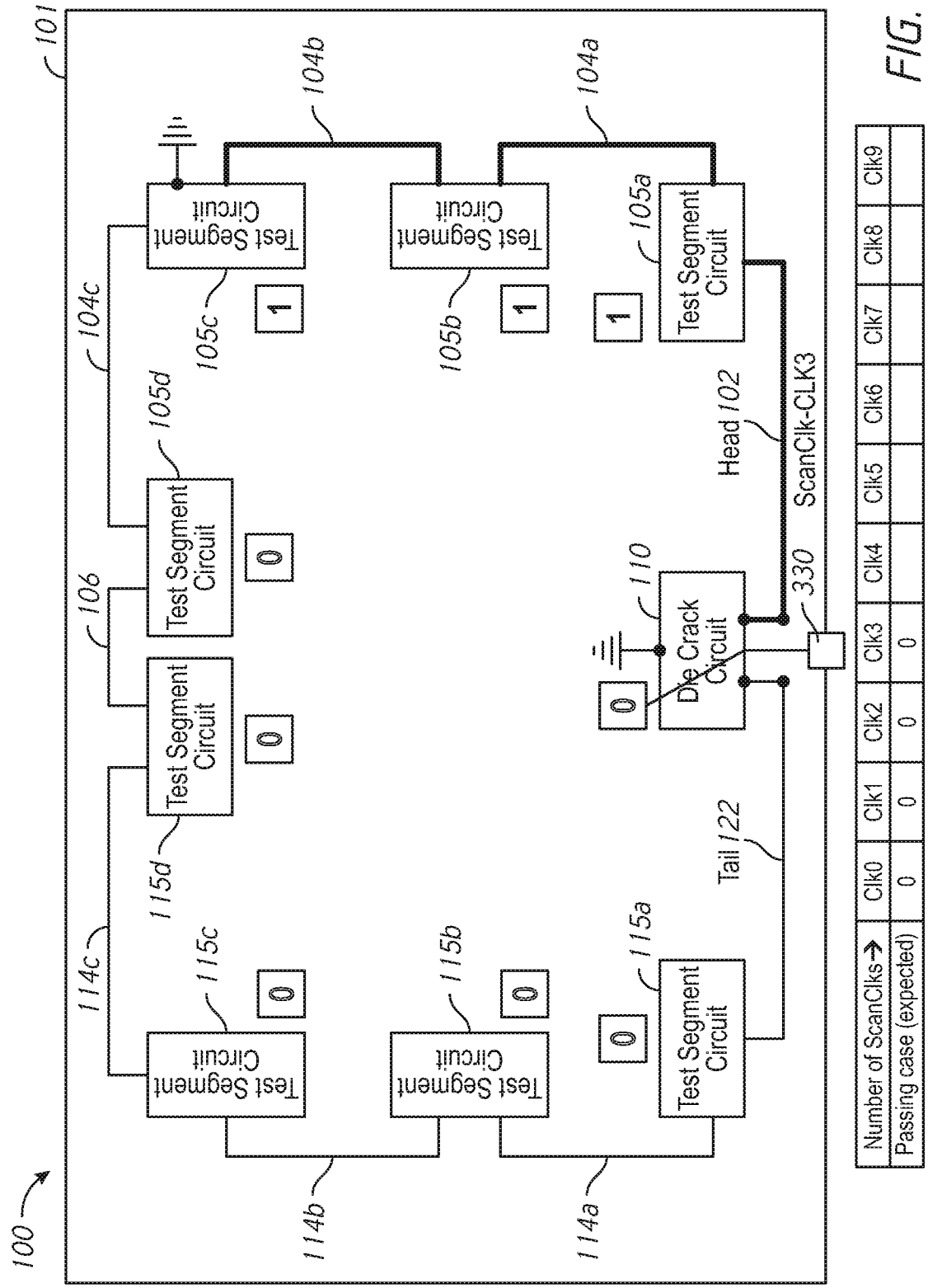

FIG. 4D shows the results of toggling the ScanClk signal a first time (CLK3) following time t3. A tail node of the segment line 104b is grounded and the segment line 104b is decoupled from the segment line 104c. Additionally, the SR latch circuit 212 of the test segment circuit 105c provides a high logic level NxtSegEn signal. The high logic level NxtSegEn signal of the test segment circuit 105c is shown in FIG. 4D as the "1" adjacent the test segment circuit 105c. Thus, the NxtSegEn signals provided by the respective SR latch circuits 212 of the test segment circuits 105a-105c are at the high logic level. The respective SR latch circuits of other test segment circuits and the die crack circuit 110 continue to have a "0" output, as shown in the table of FIG. 4D.

Figure 4E:
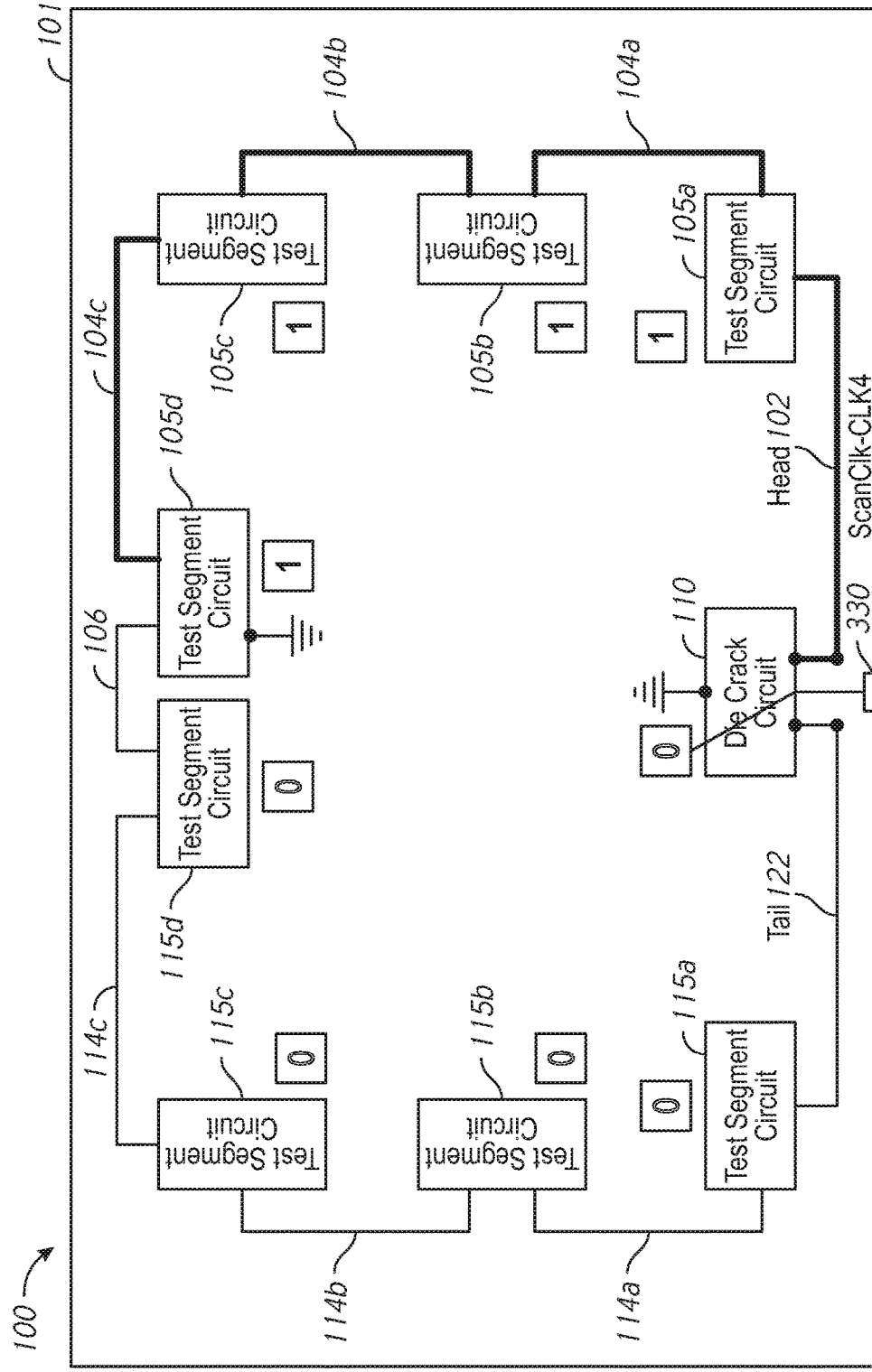

FIG. 4E shows the results of toggling the ScanClk signal a second time (CLK4) following time t3. A tail node of the segment line 104c is grounded and the segment line 104c is decoupled from the segment line 104d. Additionally, the SR latch circuit 212 of the test segment circuit 105d provides a high logic level NxtSegEn signal. The high logic level NxtSegEn signal of the test segment circuit 105d is shown in FIG. 4E as the "1" adjacent the test segment circuit 105d. Thus, the NxtSegEn signals provided by the respective SR latch circuits 212 of the test segment circuits 105a-105d are all at the high logic level. The respective SR latch circuits of other test segment circuits and the die crack circuit 110 continue to have a "0" output, as shown in the table of FIG. 4E.

Figure 4F:
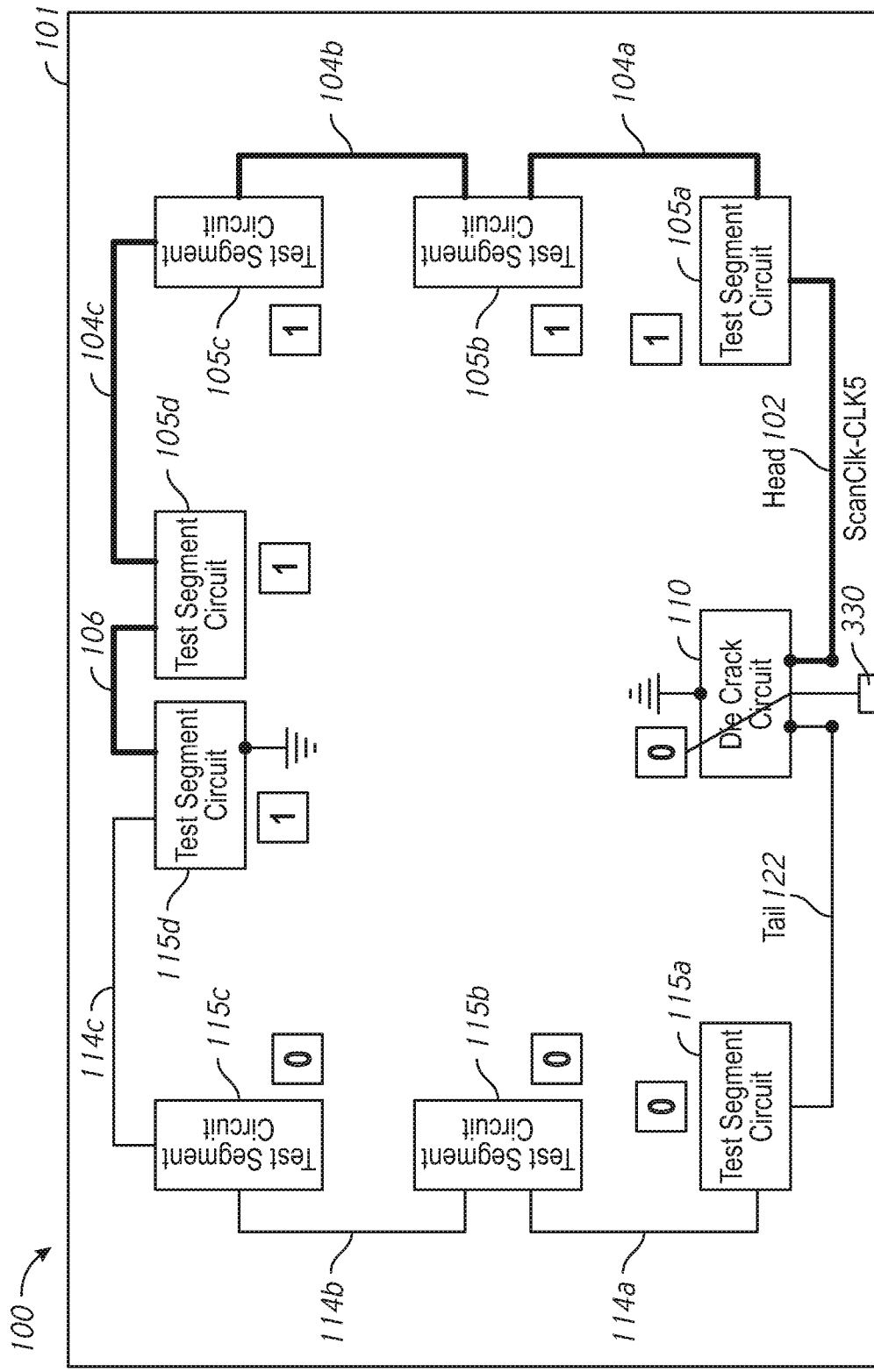

FIG. 4F shows the results of toggling the ScanClk signal a third time (CLK5) following time t3. A tail node of the segment line 106 is grounded and the segment line 106 is decoupled from the segment line 114c. Additionally, the SR latch circuit 262 of the test segment circuit 115d provides a high logic level NxtSegEn signal. The high logic level NxtSegEn signal of the test segment circuit 115d is shown in FIG. 4F as the "1" adjacent the test segment circuit 115d. Thus, the NxtSegEn signals provided by the respective SR latch circuits 212 of the test segment circuits 105a-105d and the SR latch circuit 262 of the test segment circuit 115d are all at the high logic level. The respective SR latch circuits of other test segment circuits and the die crack circuit 110 continue to have a "0" output, as shown in the table of FIG. 4F.

Figure 4G:
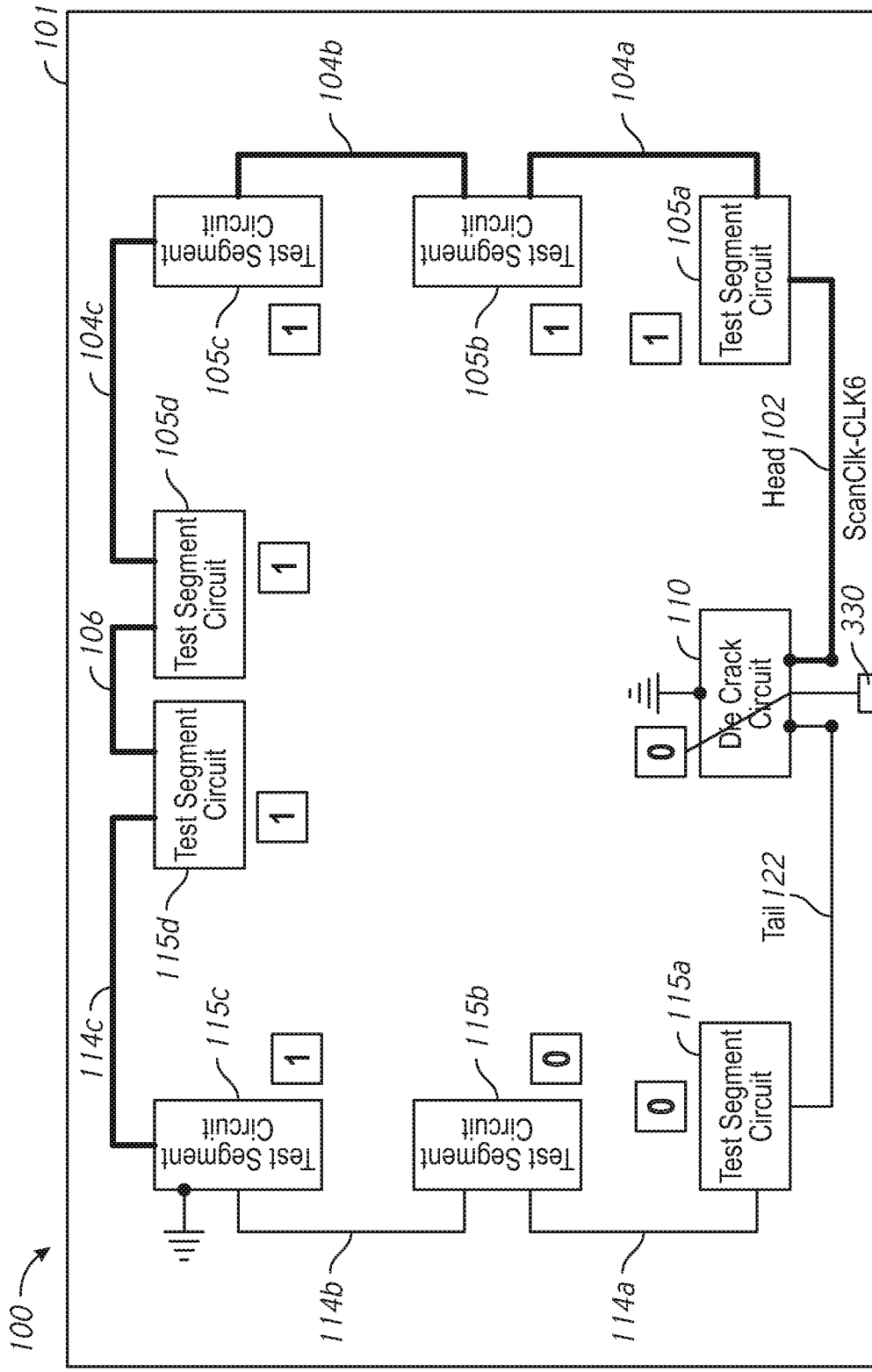

FIG. 4G shows the results of toggling the ScanClk signal a fourth time (CLK6) following time t3. A tail node of the segment line 114c is grounded and the segment line 114c is decoupled from the segment line 114b. Additionally, the SR latch circuit 262 of the test segment circuit 115c provides a high logic level NxtSegEn signal. The high logic level NxtSegEn signal of the test segment circuit 115c is shown in FIG. 4G as the "1" adjacent the test segment circuit 115c. Thus, the NxtSegEn signals provided by the respective SR latch circuits 212 of the test segment circuits 105a-105d and the SR latch circuits 262 of the test segment circuits 115d and 115c are all at the high logic level. The respective SR latch circuits of other test segment circuits and the die crack circuit 110 continue to have a "0" output, as shown in the table of FIG. 4G.

Figure 4H:
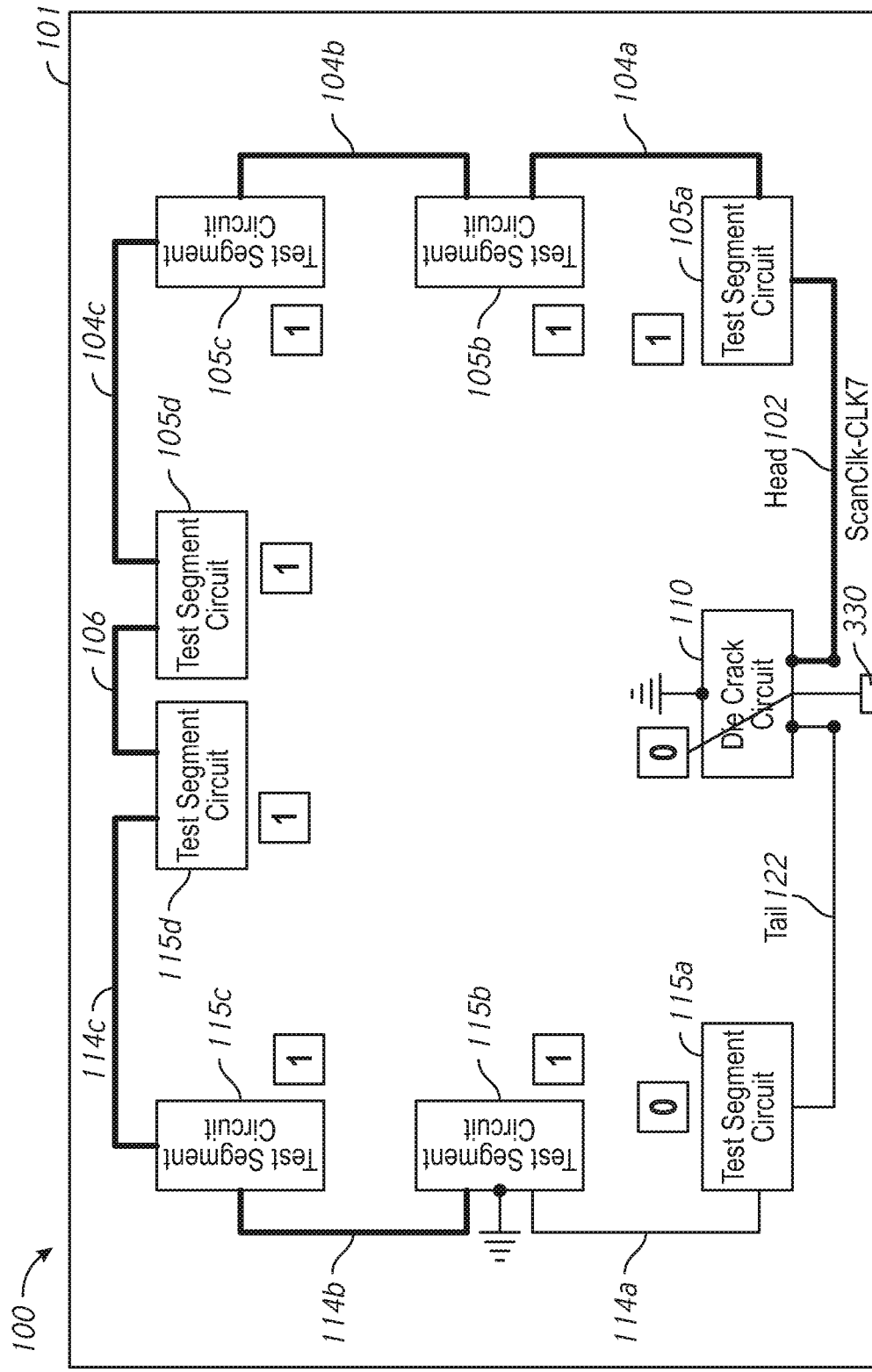
Figure 41:
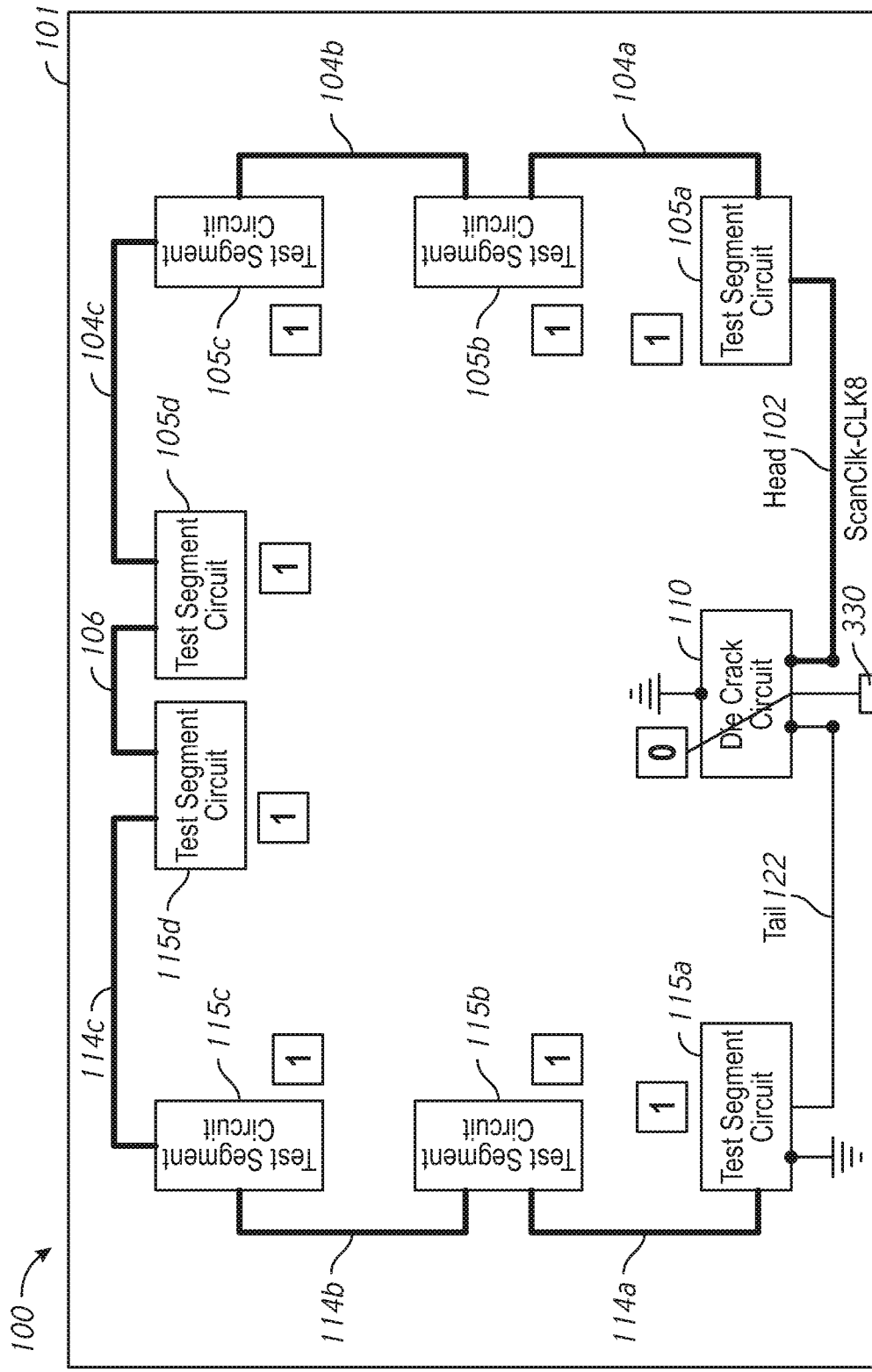

FIG. 4H shows the results of toggling the ScanClk signal a fifth time (CLK7) following time t3. A tail node of the segment line 114b is grounded and the segment line 114b is decoupled from the segment line 114a. Additionally, the SR latch circuit 262 of the test segment circuit 115*b* provides a high logic level NxtSegEn signal. The high logic level NxtSegEn signal of the test segment circuit 115*b* is shown in FIG. 4H as the "1" adjacent the test segment circuit 115*b*. Thus, the NxtSegEn signals provided by the respective SR latch circuits 212 of the test segment circuits 105*a*-105*d* and the SR latch circuits 262 of the test segment circuits 115*b*-115*d* are all at the high logic level. The respective SR latch circuits of other test segment circuits and the die crack circuit 110 continue to have a "0" output, as shown in the table of FIG. 4H.

At time t4, the ScanClk signal is again toggled (CLK8), which is received by the test segment circuits 105*a*-105*d* and 115*a*-115*d*. In response, the D latch 254 of the test segment circuit 115*b* latches the low logic level SegTog to provide a high logic level PassEn(x) signal and a low logic level PDEn(x) signal. As a result, the transistor 274 of the test segment circuit 115*b* is deactivated and the switch 270 of the test segment circuit 115*b* is activated to provide a conductive path including the segment lines from the head segment line 102 to the segment line 114*a*.

At time t5, the ScanClk signal changes to a low clock level. In response to the low logic level ScanClk signal, the D latch 254 of the test segment circuit 115*a* latches the SegTog signal. As a result, the PassEn(x) signal changes to a low logic level and the PDEn(x) signal changes to a high logic level. With the PDEn(x) signal at a high logic level, the transistor 274 of the test segment circuit 115*a* is activated to ground a tail node of the segment line 114*a* and with the PassEn(x) signal at a low logic level the switch 270 is deactivated to decouple the segment line 114*a* from the tail segment line 122. Additionally, as provided by the SR latch circuit 262 of the test segment circuit 115*a*, the SegTog signal changes to a low logic level and the NxtSegEn signal changes to a high logic level. The high logic level NxtSegEn signal of the test segment circuit 115*a* is shown in FIG. 4I as the "1" adjacent the test segment circuit 115*a*. Thus, following time t5, the NxtSegEn signals provided by the respective SR latch circuits 212 and 262 of the test segment circuits 105*a*-105*d* and 115*a*-115*d* are at the high logic level. The respective SR latch circuit 342 of the die crack circuit 110 continues to have a "0" output, as shown in FIG. 4I. The "0" output of the SR latch circuit 342 of the die crack circuit 110 is provided to the test pad 330. A device tester coupled to the test pad 330 may read the "0" output from the die crack circuit 110, which is represented by a "0" for CLK8 in the table of FIG. 4I.

At time t6, the ScanClk signal is again toggled (CLK9), which is received by the test segment circuits 105*a*-105*d* and 115*a*-115*d*, and the die crack circuit 110. In response, the D latch 254 of the test segment circuit 115*a* latches the low logic level SegTog to provide a high logic level PassEn(x) signal and a low logic level PDEn(x) signal. As a result, the transistor 274 of the test segment circuit 115*a* is deactivated and the switch 270 of the test segment circuit 115*a* is activated to provide a conductive path including segment lines from the head segment line 102 to the tail segment line 122.

Figure 4J:
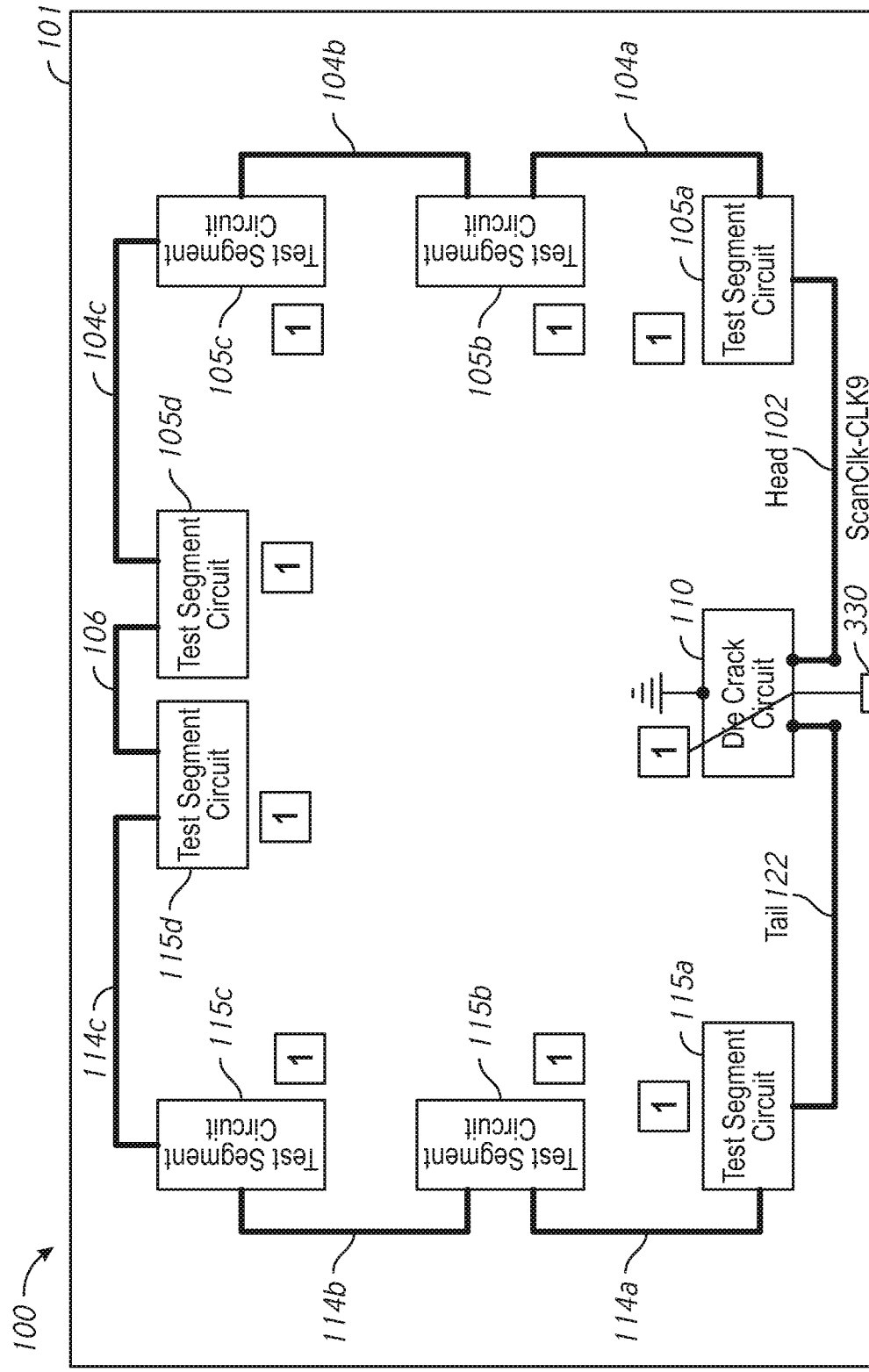

At time t7, the ScanClk signal changes to a low clock level. In response to the low logic level ScanClk signal, the D latch 334 of the die crack circuit 110 latches the SegTog signal. As a result, the PassEn(x) signal changes to a low logic level and the PDEn(x) signal changes to a high logic level. Additionally, as provided by the SR latch circuit 342 of the die crack circuit 110, the SegTog signal changes to a low logic level and the NxtSegEn signal changes to a high logic level. The high logic level NxtSegEn signal of the test segment circuit 115*a* die crack circuit is shown in FIG. 4J as the "1" adjacent the die crack circuit 110. Thus, following time t7, the NxtSegEn signals provided by the respective SR latch circuits 212 and 262 of the test segment circuits 105*a*-105*d* and 115*a*-115*d*, and the SR latch circuit 342 of the die crack circuit 110 are at the high logic level. The "1" output of the SR latch circuit 342 of the die crack circuit 110 is provided to the test pad 330. A device tester coupled to the test pad 330 may read the "1" output from the die crack circuit 110, which is represented by a "1" for CLK9 in the table of FIG. 4J.

As illustrated by the example of FIGS. 4A-4J and 5, the ScanClk signal lines 290 and the SegTogEn signal line 294 may be tested for continuity by continually toggling the ScanClk signal to cause a high logic level output by respective SR latch circuits of succeeding test segment circuits 105*a*-105*d* and 115*a*-115*d* until the SR latch circuit 342 of the die crack circuit 110 provides the high logic level output at an expected time. In the present example, which includes eight test segment circuits 105*a*-105*d* and 115*a*-115*d* and a SR latch circuit 342 in a die crack circuit 110, the expected time is at the ninth toggle (CLK9) of the ScanClk signal when a high logic level is provided at the test pad 330. The high logic level at the ninth toggle indicates that the ScanClk signal lines 290 and the SegTogEn signal line 294 are continuous for the segments line 102, 104*a*-104*c*, 106, 114*a*-114*c*, and 122.

When the output at the test pad 330 is not a high logic level at the ninth toggle of the ScanClk signal, one or both of the ScanClk signal line 290 and SegTogEn signal line 294 may not continuously conductive. In such a case, the cause may be related to a die crack or related failure mode. The testing process described with reference to FIGS. 4A-4J and 5 utilizes the ScanClk signal line 290 and the SegTogEn signal line, but does not rely on any signals provided on the signal line that may grounded through transistors 220 or 274 and coupled through switches 224 and 270 (referenced as the "bias signal line"). In embodiments of the disclosure where the signal lines are structured with vertical segmentation, the operability of the ScanClk signal line 290 and the SegTogEn signal line 294 may provide insight to the operability of the bias signal line. For example, in a vertically segmented structure having the bias signal line vertically disposed between the ScanClk line 290 and the SegTogEn signal line 294, test results which indicate correct operation suggests that the ScanClk signal line 290 and the SegTogEn signal line 294 are continuously conductive, which suggests that the bias signal line is also continuously conductive (e.g., no die crack). Conversely, test results which indicate erroneous operation suggests that the ScanClk signal line 290 and the SegTogEn signal line 294 are not continuously conductive, which suggests that the bias signal line is also not continuously conductive (e.g., potential die crack or other defect).

Figure 6A:
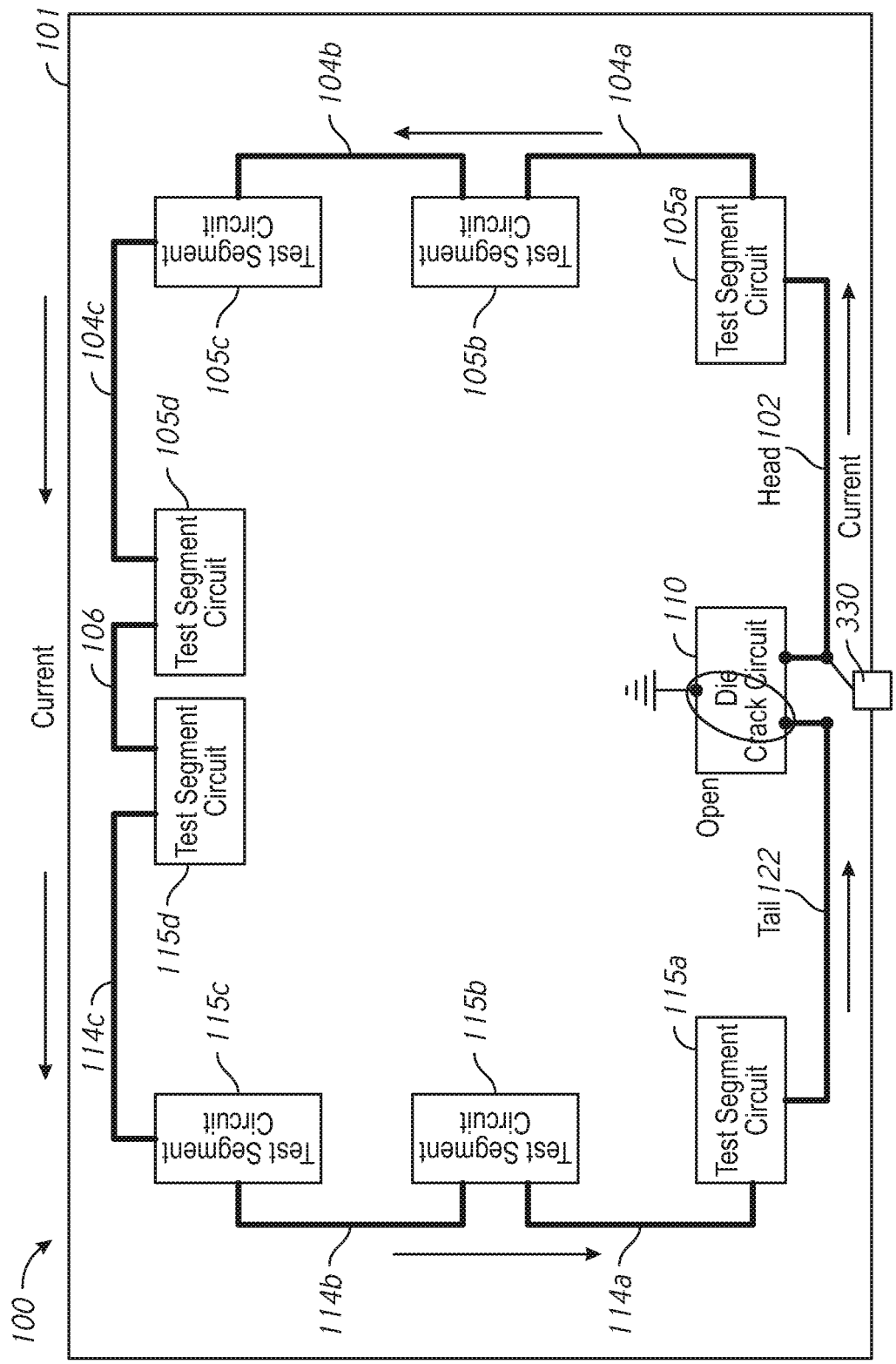
FIGS. 6A-6D are schematic diagrams illustrating a die testing operation according to an embodiment of the disclosure.
Figure 6B:
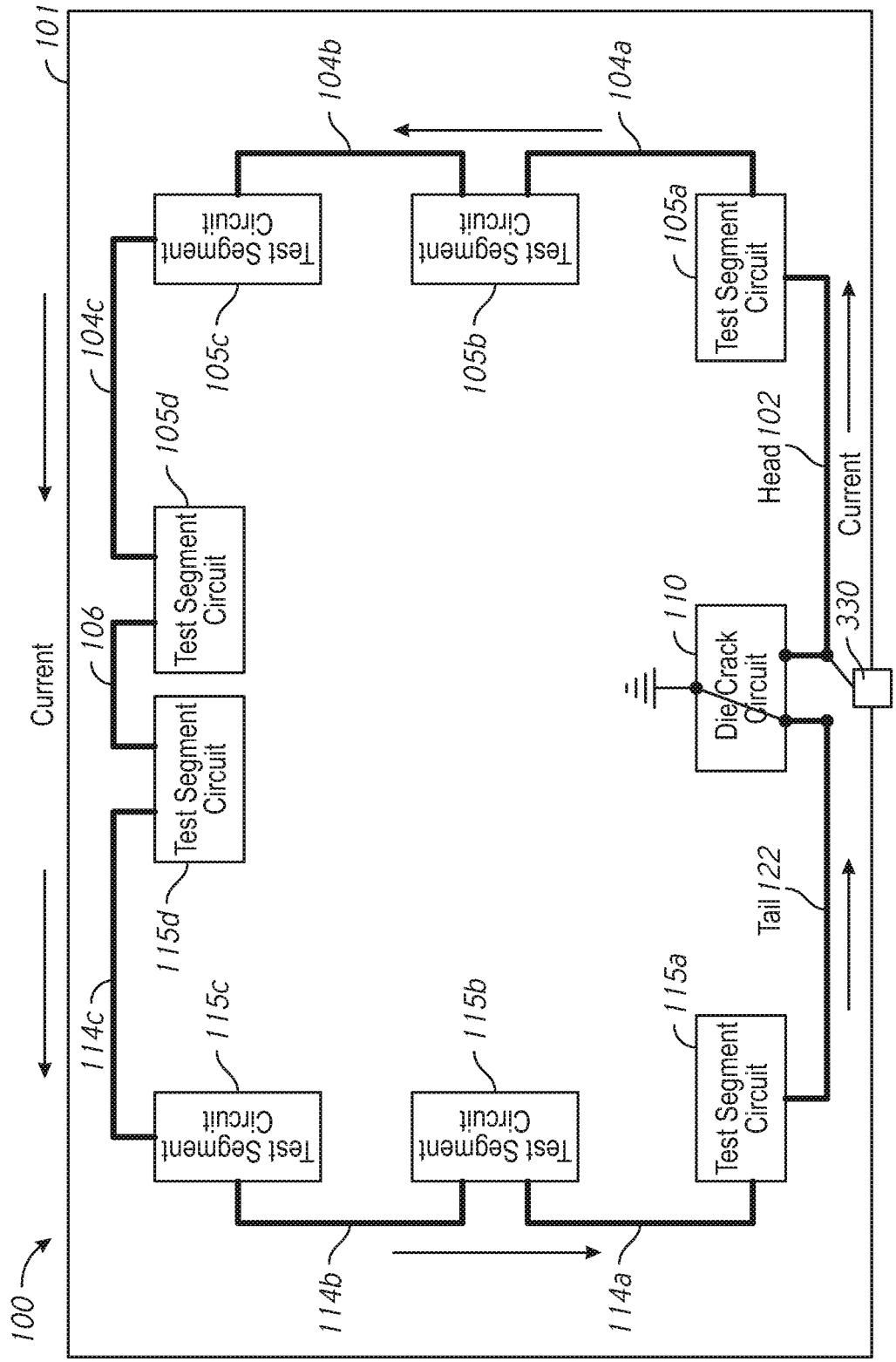
Figure 6C:
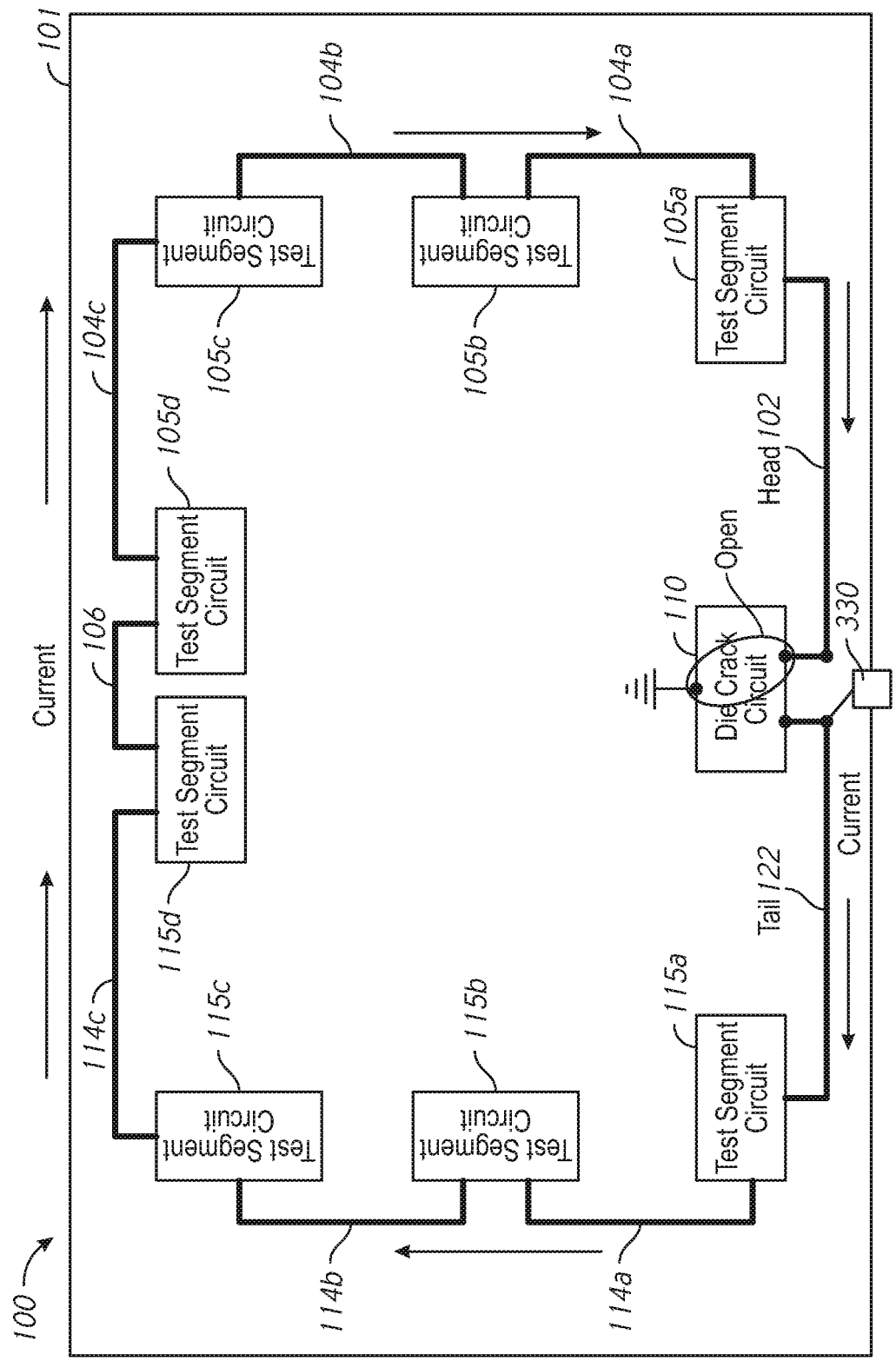
Figure 6D:
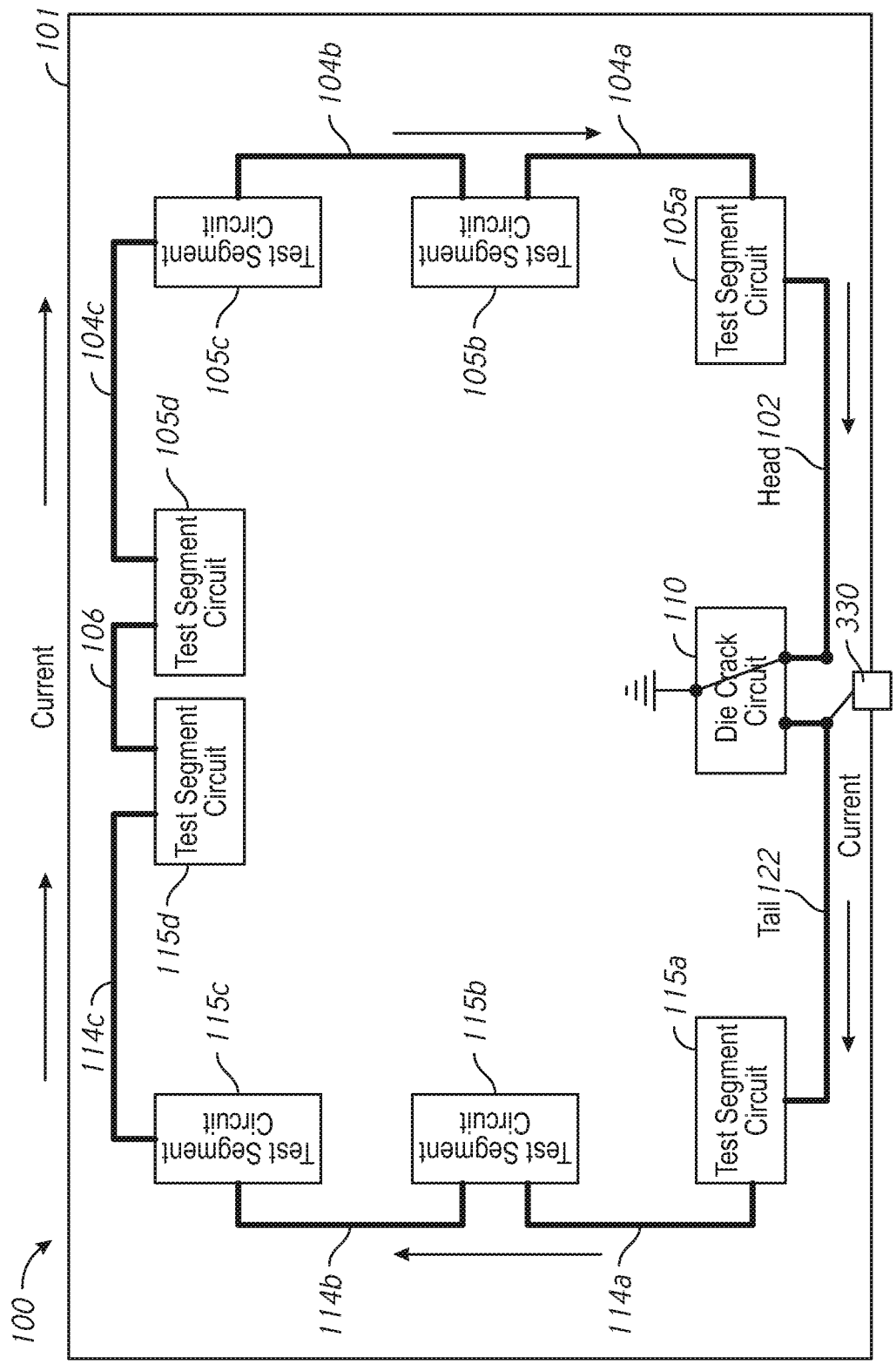
Figure 7:
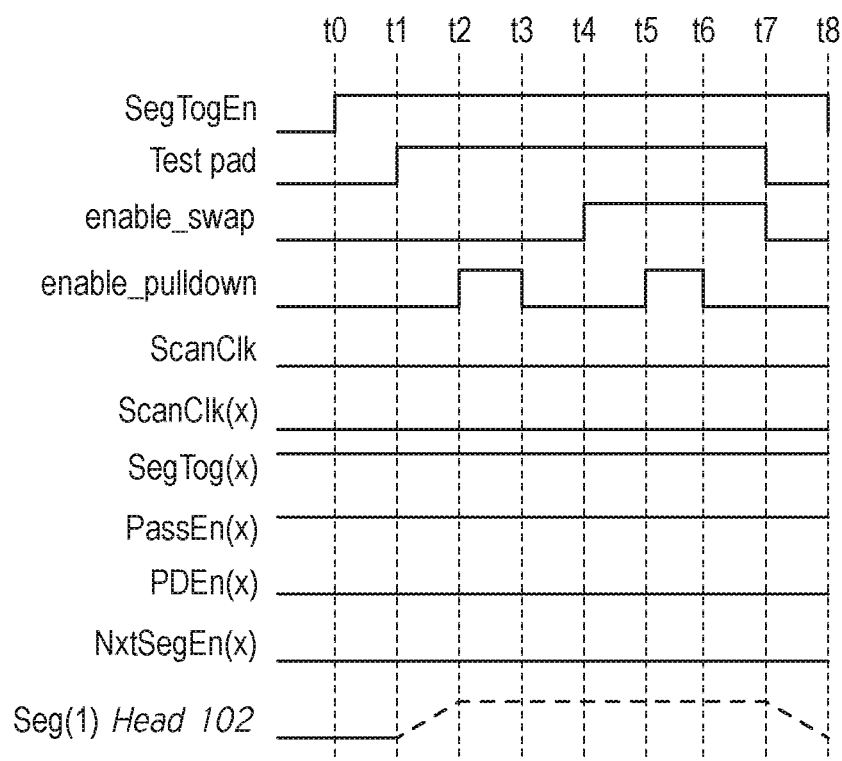
FIG. 7 is a timing diagram of various signals during operation of the testing process of FIGS. 6A-6D according to an embodiment of the disclosure.

FIGS. 6A-6D are block diagrams showing a testing process according to an embodiment of the disclosure. The testing process of FIGS. 6A-6D may be used for determining an open circuit and short circuit when the segments lines 102, 104*a*-104*c*, 106, 114*a*-114*c* and 122 are coupled together in a continuous conductive path from a head node of the head segment line 102 to a tail node of the tail segment line 122. FIG. 7 is a timing diagram of various signals during operation of the testing process of FIGS. 6A-6D. The test according to the embodiment illustrated by FIGS. 6A-6D and 7 includes a test for a short circuit and then a test for an open circuit where a driving voltage is provided to one end of the continuous conductive path (e.g., provided to the head node of the head segment line 102), followed by a test for a short circuit and then a test for an open circuit where a driving voltage is provided to the other end of the continuous conductive path. The ScanClk(x), SegTog(x), PassEn(x), PDEn(x), NxtSegEn(x), and Seg(1) shown in FIG. 7 represent voltages of the signals and nodes for each of the test segment circuits 105*a-d* and 115*a*-115*d*.

Prior to time t0, the SegTogEn signal is a low logic level, which causes the D latch circuits 204 and 254 of the test segment circuits 105*a-d* and 115*a*-115*d* to be deactivated and the SR latch circuits 212 and 262 to reset and provide a low logic level NxtSegEn(x) signal. The PassEn(x) signals are a high logic level and the PDEn(x) signals are a low logic level to provide a continuous conductive path including the segment lines between the head node of the head segment line 102 to the tail node of the tail segment line 122. It is assumed that one end of the continuous conductive path (e.g., head node of the head segment line 102 for the present example) is coupled to a test pad 330 and the other end (e.g., the tail node of the tail segment line 122 for the present example) is floating due to a low logic level enable_swap signal and a low logic level enable_pulldown signal. FIG. 6A illustrates the condition of the segment lines and the coupling of the test pad 330 in the die crack circuit 110.

At time t0, the SegTogEn changes to a high logic level to enable testing with the continuous conductive path of the segment lines, for example, the D latch circuits 204 and 254 are activated. At time t1, a voltage provided to the test pad 330 (e.g., from a device tester) changes to a relatively high voltage level (e.g., 1 volt) to test for a short circuit. A short circuit (with the tail node of the tail segment line 122 floating in the present example) may indicate a die crack. That is, a measured current (e.g., by the device tester) that is materially greater than zero may suggest that a die crack has created a current path along the continuously conductive path of segment lines to ground. The relatively high voltage provided to the test pad 330 causes a voltage to be driven onto the continuous conductive path of segment lines, and as shown in FIG. 7, a voltage at respective Seg(x) nodes of the test segment circuits 105*a-d* and 115*a*-115*d* increase following time t1.

At time t2, with the relatively high voltage level still provided to the test pad 330, the enable_pulldown signal changes to a high logic level and activates the switch 322 to couple the floating end of the continuous conductive path (e.g., the tail node of the tail segment line 122 in the present example) to ground in order to test for an open circuit. FIG. 6B illustrates the condition of the segment lines and the coupling of the test pad 330 in the die crack circuit 110. An open circuit may indicate a die crack. That is, a measured current that is less than an expected current may suggest that a die crack has created an open circuit along the continuously conductive path of segment lines.

At time t3, the enable_pulldown signal changes to a low logic level to deactivate the switch 322 to cause the end of the continuous conductive path to be floating again (e.g., the tail node of the tail segment line 122 is floating in the present example). At time t4, the enable_swap signal changes to a high logic level to cause the test pad 330 to be coupled to the opposite end of the continuously conductive path (e.g., the tail end of the tail segment line 122 is coupled to the test pad 330 in the present example). With the enable_pulldown signal still at the low logic level, the other end of the continuously conductive path (e.g., the head node of the head segment line 102) is floating. FIG. 6C illustrates the condition of the segment lines and the coupling of the test pad 330 in the die crack circuit 110. In this condition, the relatively high voltage level provided to the test pad 330 is used to test for a short circuit, but with driving a voltage from the opposite end of the continuously conductive path compared with time t1.

At time t5, the enable_pulldown signal changes to a high logic level and activates the switch 322 to couple the floating end of the continuous conductive path (e.g., the head node of the head segment line 102 in the present example) to ground in order to test for an open circuit. FIG. 6D illustrates the condition of the segment lines and the coupling of the test pad 330 in the die crack circuit 110.

At time t6 the enable_pulldown signal changes to a low logic level to deactivate the switch 322 to cause the end of the continuous conductive path to be floating (e.g., the head node of the head segment line 122 is floating in the present example). At time t7 the enable_swap signal changes to a low logic level to cause the test pad 330 to once again be coupled to the end of the continuously conductive path as prior to time t4 (e.g., the head node of the head segment line 102 is again coupled to the test pad 330 in the present example). The voltage provided to the test pad 330 changes to a relatively low voltage level. The voltage of the Seg(x) nodes of the test segment circuits 105*a-d* and 115*a*-115*d* decrease following time t7. The SegTogEn signal changes to a low logic level at time t8, ending the testing using the continuous conductive path including the segment lines 102, 104*a*-104*c*, 106, 114*a*-114*c* and 122.

FIGS. 8A-8H are block diagrams showing an iterative testing process according to an embodiment of the disclosure for determining an open circuit and short circuit while iteratively advancing through the segments lines 102, 104*a*-104*c*, 106, 114*a*-114*c* and 122. FIG. 9 is a timing diagram of various signals during an operation of the testing process of FIGS. 8A-8H. The portion of the testing process shown in FIG. 9 is for open circuit and short circuit starting with the head segment line 102 and advancing through the test segment circuits 105*a* and 105*b*. In the example, testing begins at a head node of the head segment line 102 and advances iteratively through the segment lines 104*a*-104*c*, 106, 114*a*-114*c* and 122 in a counter-clockwise manner. In other embodiments of the disclosure, the testing of open circuits and short circuits may progress in a different manner (e.g., starting at a tail node of the tail segment line 122 and advancing in a clockwise manner, switching back and forth between the head node of the head segment line 102 and the tail node of the tail segment line 122 and advancing in both the counter-clockwise and clockwise directions to the point 106, etc.). The example of FIGS. 8A-8H and 9 is not intended to limit the scope of the disclosure to the particular example.

Prior to time t0, the SegTogEn signal is a low logic level, which causes the D latch circuits 204 and 254 of the test segment circuits 105*a-d* and 115*a*-115*d* to be deactivated and the SR latch circuits 212 and 262 to reset and provide a low logic level NxtSegEn(x) signal. The PassEn(x) signals are a high logic level and the PDEn(x) signals are a low logic level to provide a continuous conductive path including the segments lines 102, 104*a*-104*d*, 106, 114*a*-114*d*, and 122 between a head node of the head segment line 102 to a tail node of the tail segment line 122 (or vice versa). It is assumed for the present example that the head node of the head segment line 102 is coupled to a test pad 330 and the tail node of the tail segment line 122 is floating due to a low logic level enable_swap signal and a low logic level enable_pulldown signal.

Figure 8A:
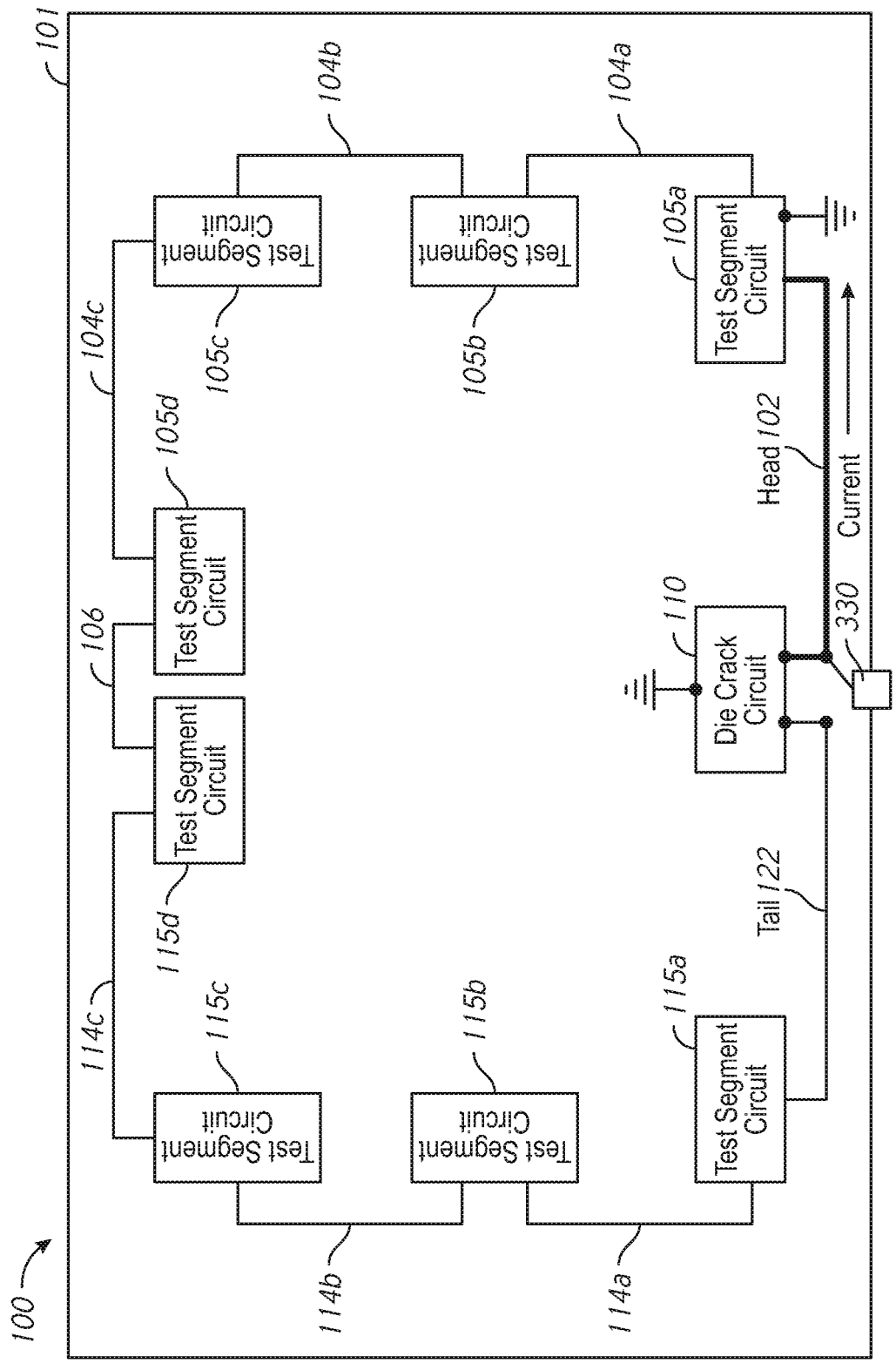
FIG. 8A-8H are block diagrams showing an iterative testing process according to an embodiment of the disclosure.
Figure 9:
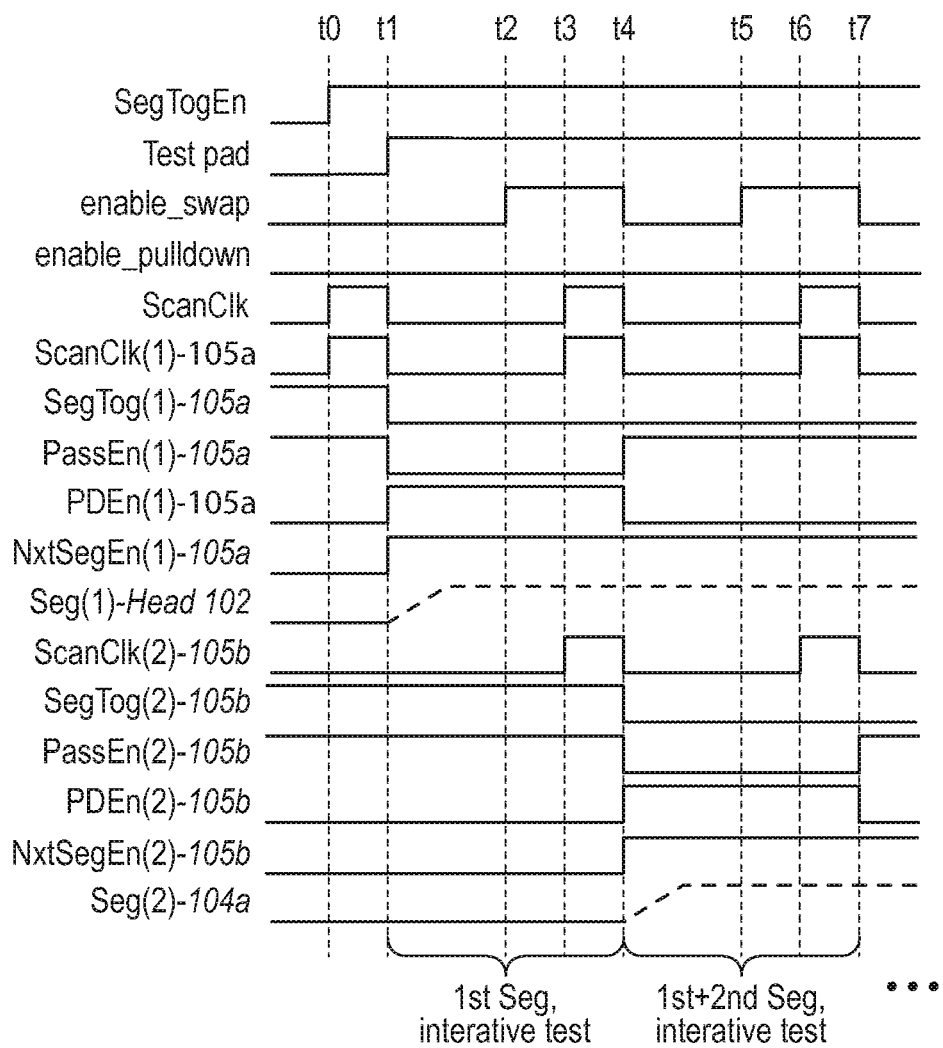
FIG. 9 is a timing diagram of various signals during an operation of the testing process of FIGS. 8A-8H according to an embodiment of the disclosure.

At time t0, and as shown in FIG. 8A, the head segment line 102 is tested for an open circuit. The SegTogEn changes to a high logic level to enable testing of the segment lines, for example, the D latch circuits 204 and 254 are activated. Also at time t0, the ScanClk signal is toggled, which is received by the test segment circuit 105a. At time t1, the ScanClk signal changes to a low clock level causing the D latch 204 of the test segment circuit 105a to latch the SegTog signal. As a result, the PassEn(x) signal changes to a low logic level and the PDEn(x) signal changes to a high logic level. Additionally, as provided by the SR latch circuit 212 of the test segment circuit 105a, the SegTog signal changes to a low logic level and the NxtSegEn signal changes to a high logic level. With the PDEn(x) signal at a high logic level, the transistor 220 is activated to ground a tail node of the head segment line 102 and with the PassEn(x) signal at a low logic level the switch 224 is deactivated to decouple the head segment line 102 from the segment line 104a.

Also at time t1, a voltage provided to the test pad 330 (e.g., from a device tester) changes to a relatively high voltage level (e.g., 1 volt) to test for an open circuit. For example, the relatively high voltage provided to the test pad 330 is applied to the head segment line 102 to cause a voltage at the Seg(x) node of the test segment circuits 105a to increase following time t1. The voltage increase causes a current through the head segment line 102 to ground. The current may be measured (e.g., by the device tester) to determine if an open circuit is present along the head segment line 102. An open circuit may indicate a die crack that has created an open circuit along the head segment line 102. That is, a measured current that is less than an expected current may suggest that a die crack has created an open circuit along the head segment line 102. The previously described open circuit test described with reference to times t0 and t1 is shown by FIG. 8A.

Figure 8B:
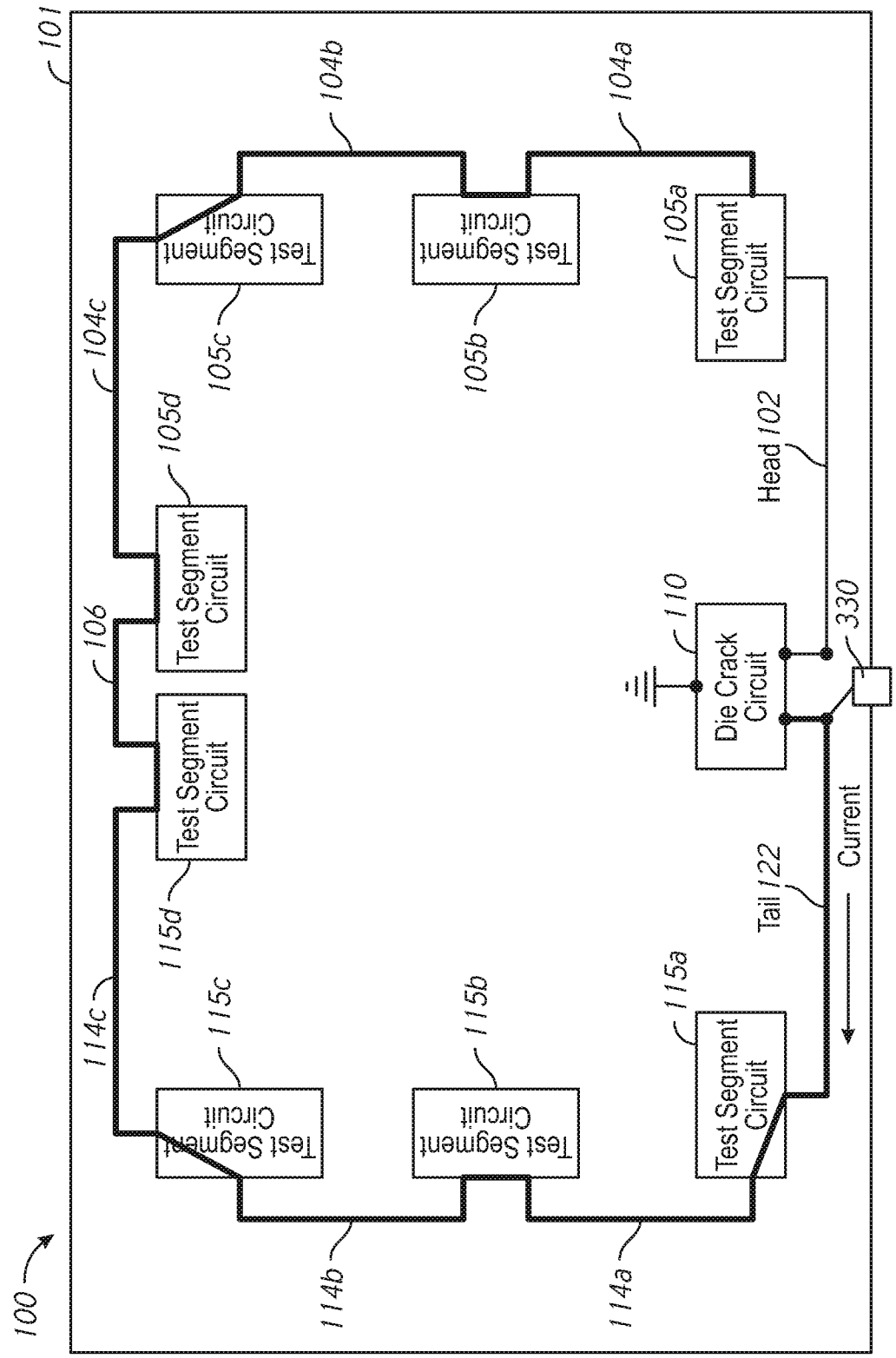

Following the open circuit testing of the head segment line 102, a conductive path including the segment lines 122, 114a-114c, 106, and 104a-104c is tested for a short circuit. At time t2, and as shown by FIG. 8B, the enable_swap signal changes to a high logic level to cause the test pad 330 to be coupled to the tail node of the tail segment line 122. The enable_pulldown signal remains at a low logic level to continue deactivating the switch 224 so that the head node of the head segment line 102 is floating. Additionally, the PassEn(x) signal for the test segment circuits 105b-105d and 115a-115d are at a high logic level to activate the respective switches 224 and the PDEn(x) signals are at a low logic level to deactivate the respective transistors 220 to provide a continuous conductive path through the segment lines 122, 114a-114c, 106, and 104a-104c from the test pad 330 to the deactivated switch 224 of the test segment circuit 105a. A relatively high voltage continues to be provided to the test pad 330, which is applied to the tail node of the tail segment line 122. In this condition, the relatively high voltage level provided to the test pad 330 is used to test for a short circuit in the conductive path including the segment lines 122, 114a-114c, 106, and 104a-104c. For example, the relatively high voltage provided to the test pad 330 is applied to the conductive path from the tail node of the tail segment line 122 through the segment line 104a. The current may be measured to determine if a short circuit is present along the continuous conductive path. A short circuit as evidenced by high comparative current flow may indicate a die crack that has created a current path along the continuous conductive path. The previously described short circuit test described with reference to time t2 may be represented by FIG. 8B.

Figure 8C:
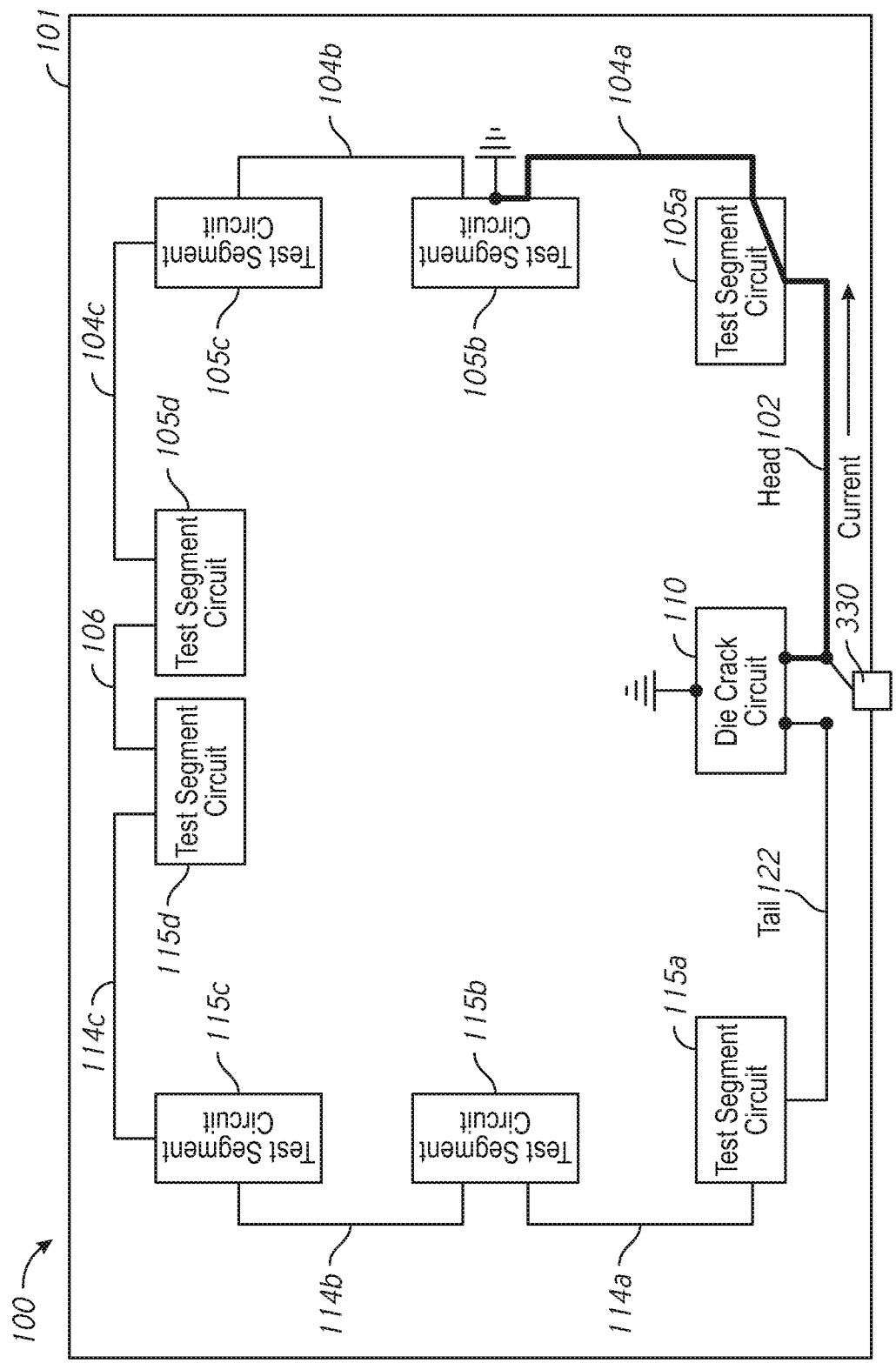

Following the short circuit testing of the conductive path including the segment lines 122, 114a-114c, 106, and 104a-104c, a conductive path from the head node of the head segment line 102 and including the segment line 104a is tested for an open circuit. At time t3, and as shown in FIG. 8C, the ScanClk signal is again toggled, which is received by the test segment circuit 105a, and due to the high logic level of the NxtSegEn signal of the test segment circuit 105a, the test segment circuit 105b also receives the toggled ScanClk signal. At time t4, the ScanClk signal changes to a low clock signal. In response, the D latch 204 of the test segment circuit 105a latches the low logic level SegTog signal to provide a high logic level PassEn(x) signal and a low logic level PDEn(x) signal. As a result, the transistor 220 of the test segment circuit 105a is deactivated and the switch 224 of the test segment circuit 105a is activated to provide a conductive path including the head segment line 102 and the segment line 104a. Also in response to the low logic level ScanClk signal, the D latch 204 of the test segment circuit 105b latches the SegTog signal. As a result, the PassEn(x) signal changes to a low logic level and the PDEn(x) signal changes to a high logic level. Additionally, as provided by the SR latch circuit 212 of the test segment circuit 105b, the SegTog signal changes to a low logic level and the NxtSegEn signal changes to a high logic level. With the PDEn(x) signal at a high logic level, the transistor 220 of the test segment circuit 105b is activated to ground a tail node of the segment line 104a and with the PassEn(x) signal at a low logic level the switch 224 is deactivated to decouple the segment line 104a from the segment line 104b.

Also at time t4, the enable_swap signal changes to a low logic level to cause the die crack circuit 110 to couple the test pad 330 to the head node of the head segment line 102. The enable_pulldown signal is still low so that the tail node of the tail segment line 122 is floating. In this configuration, the relatively high voltage that is applied to the test pad 330 is used to test for an open circuit. For example, the relatively high voltage provided to the test pad 330 is applied to the head segment line 102 to cause a voltage at the Seg(x) node of the test segment circuit 105a as well as a voltage at the Seg(x) node of the test segment circuit 105b to increase following time t4. The voltage increase causes a current through the head segment line 102 and the segment line 104a to ground. The current may be measured to determine if an open circuit is present along the conductive path including the head segment line 102 and the segment line 104a. A measured current that is less than an expected current may suggest that a die crack has created an open circuit along the head segment line 102 and segment line 104a. Assuming that the open circuit was not identified in the head segment line 102 during the open testing at time t1, an open circuit at this time may indicate a die crack that has created an open circuit along the segment line 104a. The previously described open circuit test described with reference to times t3 and t4 may be represented by FIG. 8C.

Figure 8D:
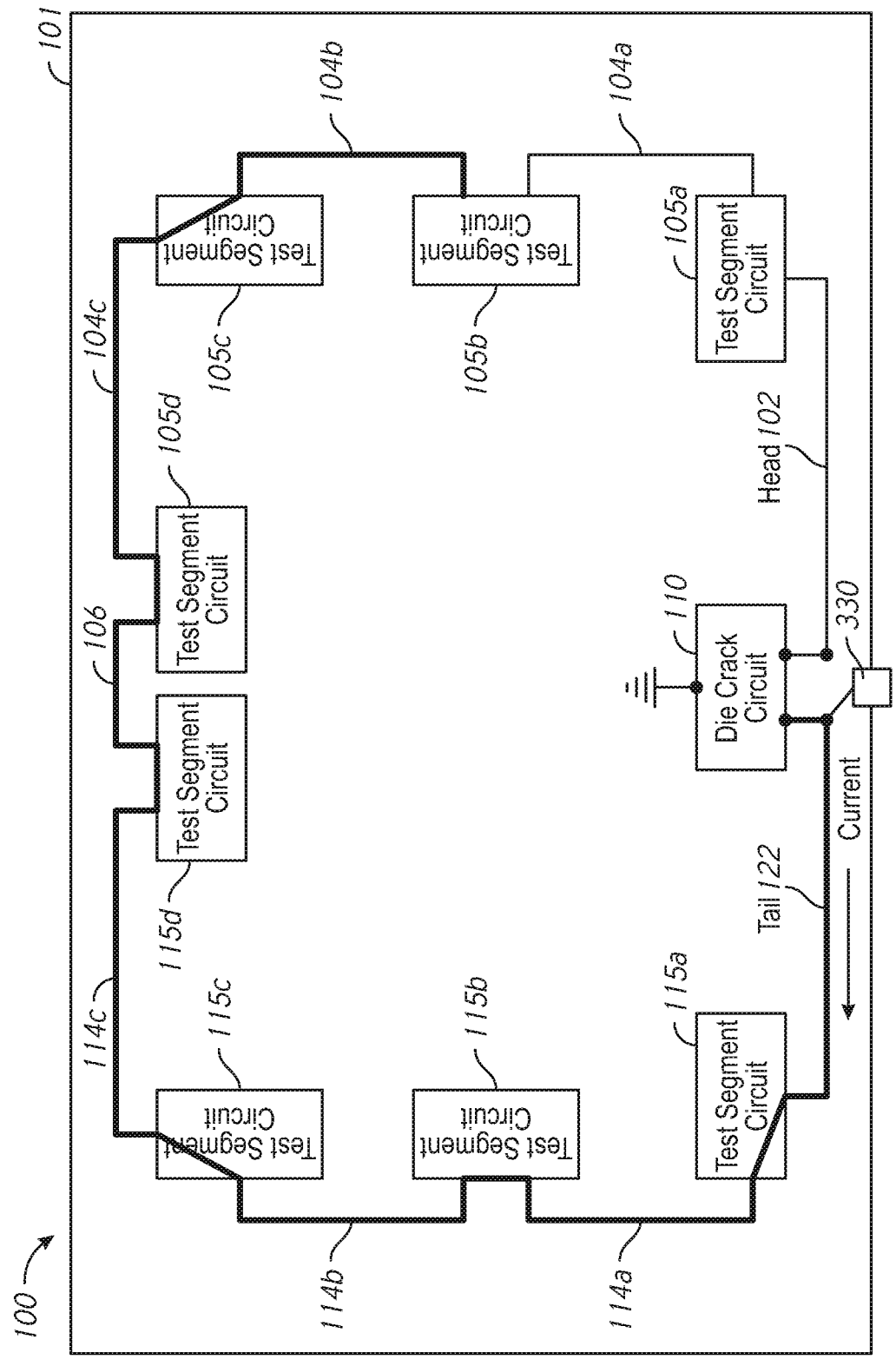

Following the open circuit testing of the conductive path including the head segment line 102 and the segment line 104a, a conductive path including the segment lines 122, 114a-114c, 106, and 104b-104c is tested for a short circuit. At time t5, and as shown in FIG. 8D, the enable_swap signal changes to a high logic level to cause the test pad 330 to be coupled to the tail node of the tail segment line 122. With the enable_pulldown signal still at the low logic level, the head node of the head segment line 102 is floating. Additionally, the PassEn(x) signal for the test segment circuits 105c-105d and 115a-115d are at a high logic level to activate the respective switches 224 and the PDEn(x) signals are at a low logic level to deactivate the respective transistors 220 to provide a continuous conductive path through the segment lines 122, 114a-114c, 106, and 104b-104c from the test pad 330 to the deactivated switch 224 of the test segment circuit 105b. The relatively high voltage continues to be provided to the test pad 330, which is applied to the tail node of the tail segment line 122. In this condition, the relatively high voltage level provided to the test pad 330 is used to test for a short circuit in the conductive path including the segment lines 122, 114a-114c, 106, and 104b-104c. For example, the relatively high voltage provided to the test pad 330 is applied to the conductive path from the tail node of the tail segment line 122 through the segment line 104b. The current may be measured to determine if a short circuit is present along the continuous conductive path. A short circuit may indicate a die crack creating a current path along the continuous conductive path. By comparing the results of this short circuit testing with the results of the short circuit testing at the second time, additional insight to the condition of the segment line 104a may be gleaned. The previously described short circuit test described with reference to time t5 may be represented by FIG. 8D.

At time t6, the ScanClk signal is again toggled, which is received by the test segment circuits 105a and 105b, and due to the high logic level of the NxtSegEn signal of the test segment circuit 105b, the test segment circuit 105c also receives the toggled ScanClk signal. At time t7, the ScanClk signal changes to a low clock level. In response, the D latch 204 of the test segment circuit 105b latches the low logic level SegTog to provide a high logic level PassEn(x) signal and a low logic level PDEn(x) signal. As a result, the transistor 220 of the test segment circuit 105b is deactivated and the switch 224 of the test segment circuit 105b is activated to provide a conductive path including the head segment line 102 and the segment line 104c.

Also in response to the low logic level ScanClk signal, the D latch 204 of the test segment circuit 105c latches the SegTog signal. As a result, the PassEn(x) signal changes to a low logic level and the PDEn(x) signal changes to a high logic level. Additionally, as provided by the SR latch circuit 212 of the test segment circuit 105c, the SegTog signal changes to a low logic level and the NxtSegEn signal changes to a high logic level. With the PDEn(x) signal at a high logic level, the transistor 220 of the test segment circuit 105c is activated to ground a tail node of the segment line 104b and with the PassEn(x) signal at a low logic level the switch 224 is deactivated to decouple the segment line 104b from the segment line 104c. FIG. 9 does not show the ScanClk signal, SegTog, PassEn(x), PDEn(x), NxtSegEn(x), and Seg(1) signals for the test segment circuit 105c, but the signals would be similar to the same signals for the test segment circuit 105b between times t3 and t4, but shifted in time to times t6 and t7.

Also at time t7, the enable_swap signal changes to a low logic level to cause the die crack circuit 110 to couple the test pad 330 to the head node of the head segment line 102. The enable_pulldown signal is still low so that the tail node of the tail segment line 122 is floating. In this configuration, the relatively high voltage that is applied to the test pad 330 is used to test for an open circuit. For example, the relatively high voltage provided to the test pad 330 is applied to the head segment line 102 to cause a voltage at the Seg(x) nodes of the test segment circuits 105a and 105b, as well as a voltage at the Seg(x) node of the test segment circuit 105c to increase following time t7. The voltage increase causes a current through the head segment line 102 and the segment lines 104a and 104b to ground. The current may be measured to determine if an open circuit is present along the conductive path including the head segment line 102, the segment line 104a, and the segment line 104b. A measured current that is less than an expected current may suggest that a die crack has created an open circuit along the head segment line 102 and segment lines 104a and 104b. Assuming that the open circuit was not identified in the head segment line 102 and segment line 104b during the open testing at times t1 and t4, an open circuit at this time may indicate a die crack that has created an open circuit along the segment line 104b.

Although not shown in FIG. 9, the open circuit and short circuit testing may continue around the segment lines until a last segment line, for example, the tail segment line 122. Following the open circuit testing of the conductive path including the segment lines 102 and 104a-104b, the testing process of open circuits along with the testing of short circuits for the segment lines iteratively advances in a counter-clockwise manner, with the length of the conductive path for open circuit testing increasing and the length of the conductive path for the short circuit testing decreasing.

Figure 8E:
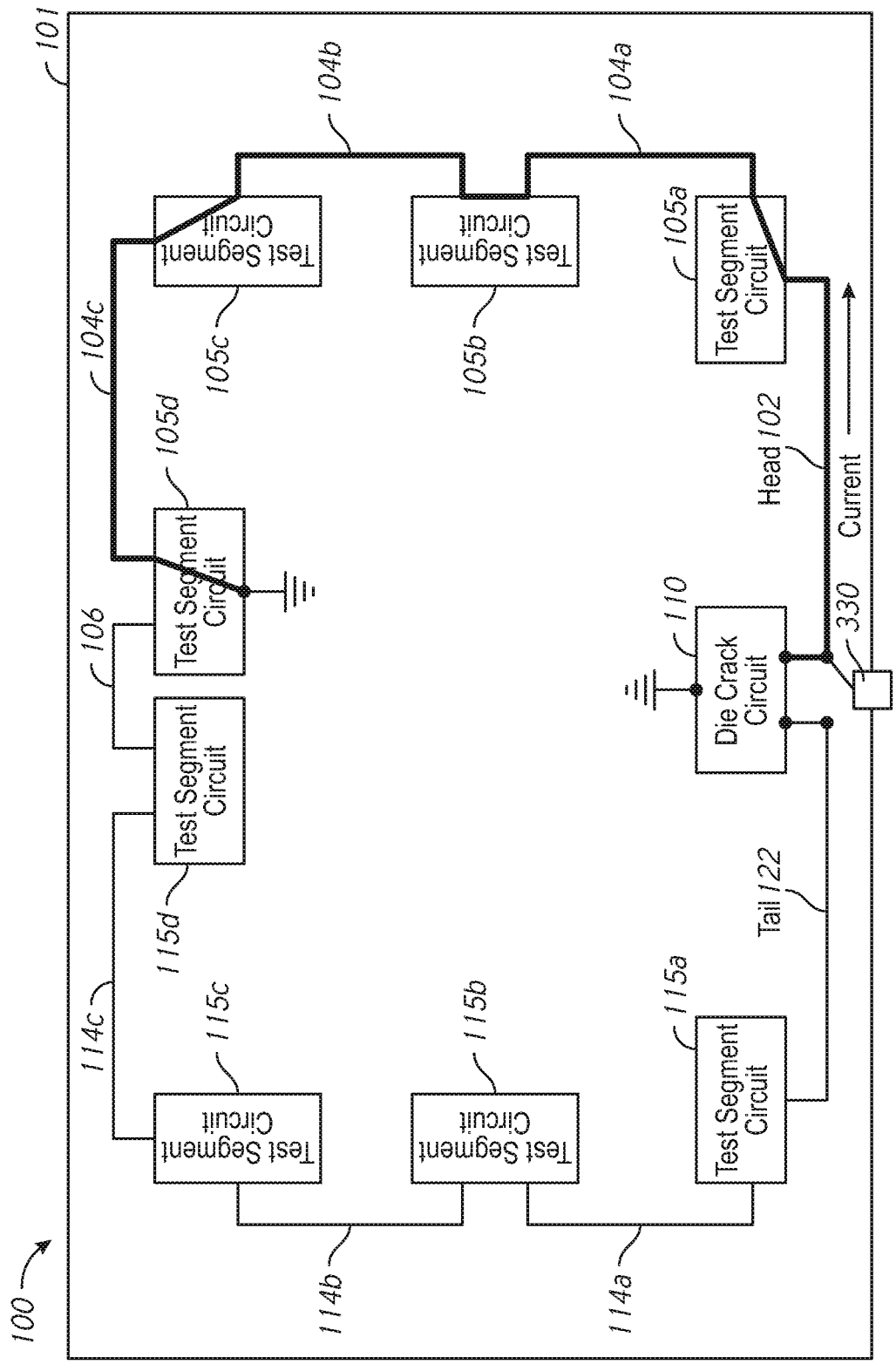
Figure 8F:
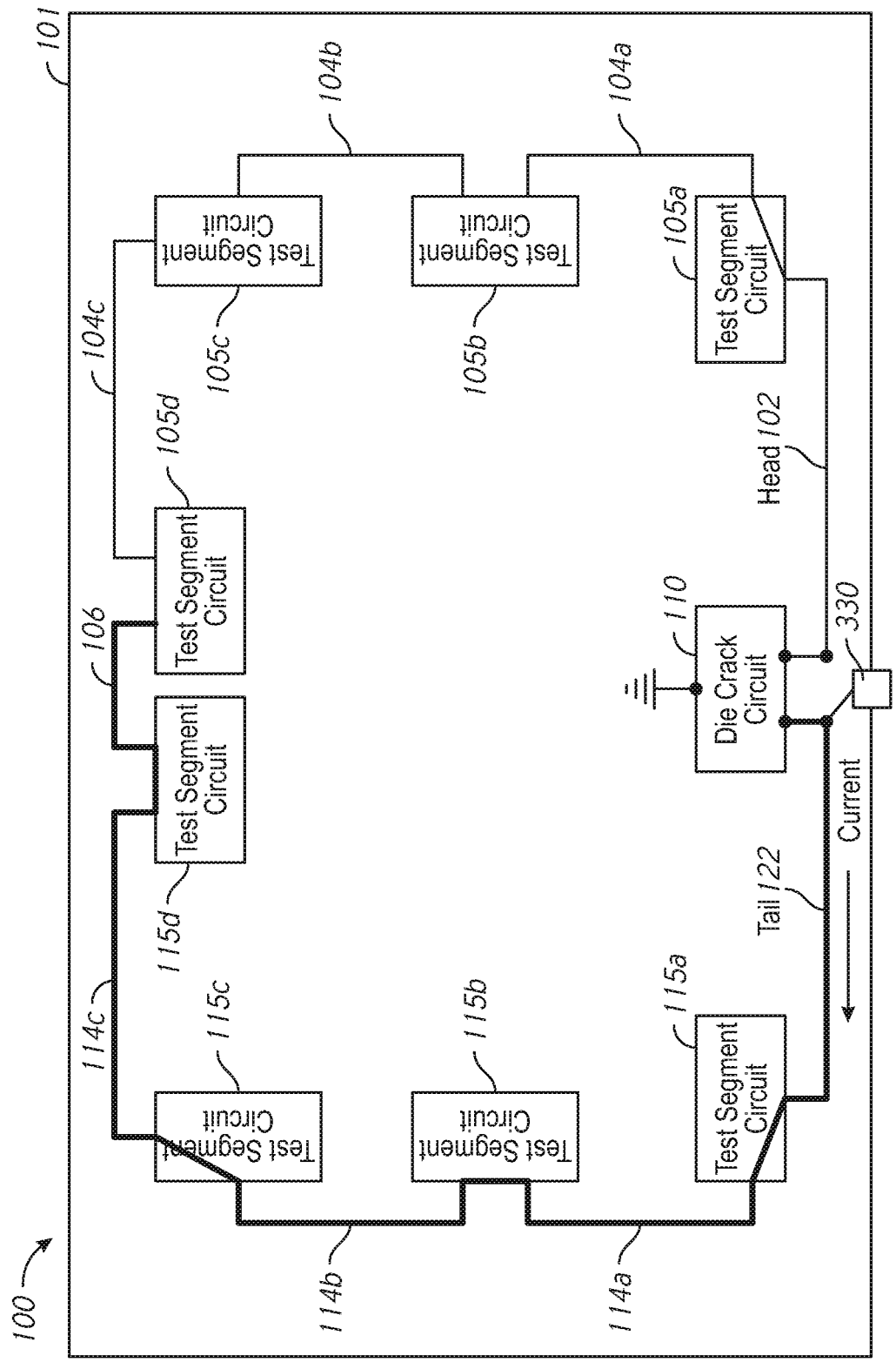

FIG. 8E shows open circuit testing for a conductive path including the head segment line 102 and the segment lines 104a-104c that is coupled to ground by the test segment circuit 105d, and FIG. 8F shows short circuit testing for a conductive path including the tail segment line 122, the segment lines 114a-114c, and 106.

Figure 8G:
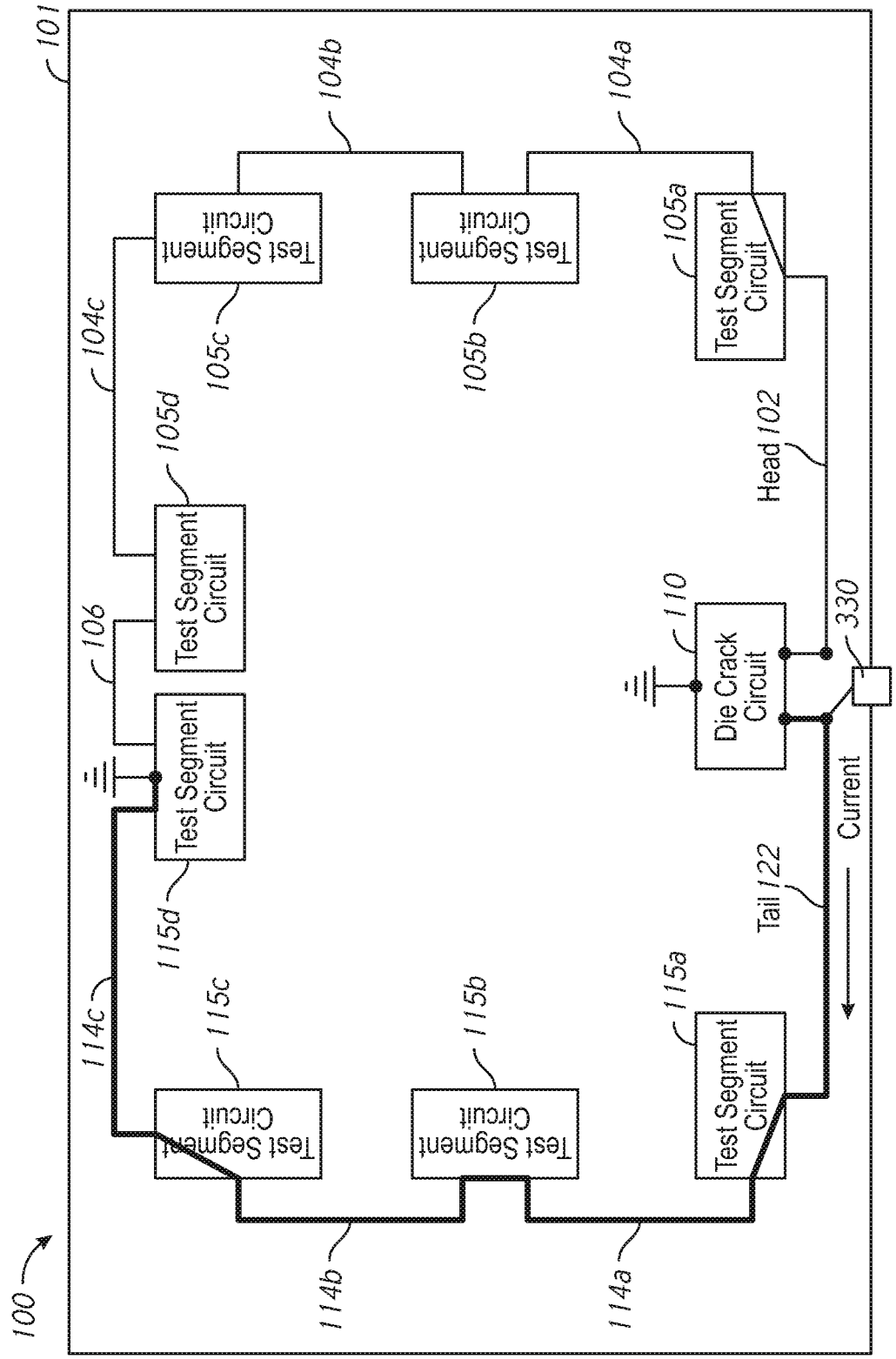

Following the short circuit testing of the conductive path including the segment lines 122, 114a-114c, and 106, as shown in FIG. 8G, a conductive path from the tail node of the tail segment line 122 and including the segment lines 114a-114c is tested for an open circuit. In effect, the open testing past the point 106 is performed by driving a voltage from the tail node of the tail segment line 122 and measuring a current that may flow in a clockwise direction along the segment lines 122 and 114a-114c, which is the reverse of the open circuit testing for the segment lines 102 and 104a-104c. The ScanClk is toggled following the short circuit testing shown in FIG. 8F to cause the PassEn(x) for the segment test circuit 105d to change to a high logic level to activate the respective switch 224 and the PDEn(x) to change to a low logic level to deactivate the respective transistor 220. The toggling of the ScanClk also causes the D latch circuit 204 of the test segment circuit 115d to latch a SegTog signal, resulting in the PassEn(x) signal for the test segment circuit 115d to change to a low logic level to deactivate the respective switch 224 (of the test segment circuit 115d) and the PDEn(x) to change to a high logic level to activate the respective transistor 220 (of the test segment circuit 115d). As a result, a conductive path is created from the tail node of the tail segment line 122 through the segment lines 114a-114c to ground. Additionally, the enable_swap signal is at a high low logic level to couple the test pad 330 to the tail node of the tail segment line 122 and the enable_pulldown signal is at a low logic level to deactivate the switch 224 so that the head node of the head segment line 102 is floating. As a result, a relatively high voltage provided to the test pad 330 is applied to the tail segment line 122 to create a current through the tail segment line 122 and the segment lines 114a-114c to ground. The current may be measured to determine if an open circuit is present along the conductive path including the tail segment line 122 and the segment lines 114a-114c.

Figure 8H:
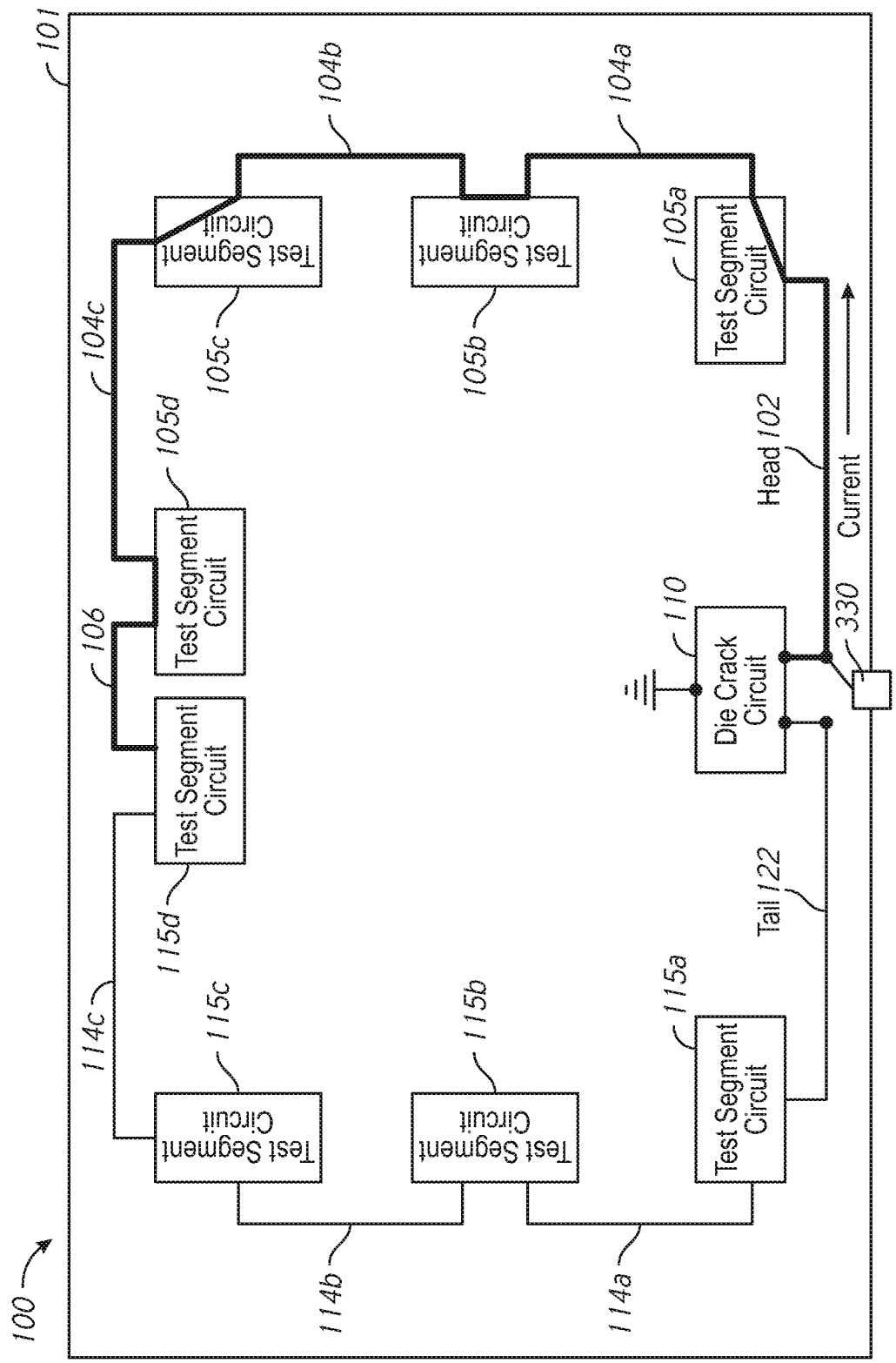

Following the open circuit testing of the conductive path including the tail segment line 122 and the segment lines 114a-114c, as shown in FIG. 8H, a conductive path including the segment lines 102, 104a-104c, and 106 is tested for a short circuit. However, in contrast with the previous short circuit testing of providing a voltage to the tail node of the tail segment line 122, the short circuit testing past the point 106 is performed by providing a voltage to the head node of the head segment line 102. The enable_swap signal is at a low logic level and the enable_pulldown signal remains at the low logic level so that the test pad 330 is coupled to the head node of the head segment 102 and the tail node of the tail segment line 122 is floating. As previously discussed for the open testing past the point 106, the PassEn(x) signal for the test segment circuit 115d is at a low logic level to deactivate the respective switch 224 of the test segment circuit 115d, and decouple the conductive path including the segment lines 102, 104a-104c, and 106 from the conductive path including the segment lines 122 and 114a-114c. As a result, a relatively high voltage provided to the test pad 330 is applied to the continuous conductive path from the head node of the head segment line 122 through the segment line of the point 106. The current may be measured to determine if a short circuit is present along the continuous conductive path. A short circuit may indicate a die crack creating a current path along the continuous conductive path to ground. By comparing the results of this short circuit testing with the results of the previous short circuit testing, additional insight to the condition of the segment lines may be gleaned.

One or more of the previously described testing processes may be combined together into a testing procedure that may be used during the manufacture of semiconductor dies. The testing process of FIGS. 4A-4J and 5 may be used as an initial test to quickly analyze for defects such as die crack due to the speed of the testing process. The testing process of FIGS. 6A-6D and 7 may be used to test for defects that cause open circuits and short circuits for the full ring of segment lines around the die. The testing process of FIGS. 8A-8H and 9 may be used to test for defects that cause open circuits and short circuits for the individual segment lines due to the iterative progression of the test process segment line by segment line. The testing processes may be combined into different embodiments to perform desired testing.

The structures and architectures described above may be incorporated into memory (e.g., DRAM, SRAM, NAND, 3D Xpoint, PCM, NOR etc.) and/or otherwise may be utilized in electronic systems. Such electronic systems may be any of a broad range of systems and semiconductor devices, such as, for example, processors, clocks, televisions, cell phones, personal computers, automobiles, industrial control systems, aircraft, etc.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
a plurality of segment lines configured to form a ring around a die, each segment line comprising:
a portion of a first signal line;
a portion of a second signal line; and
a portion of a third signal line; and
a plurality of test segment circuits, each test segment circuit coupled to at least two segment lines of the plurality of segment lines,
each test segment circuit coupled to the portion of the first signal line, the portion of the second signal line, and the portion of the third signal line, and
each test segment circuit configured to control an operation performed on at least one segment line of the plurality of segment lines, wherein each test segment circuit comprises:
a respective first latch circuit configured to receive a first signal that activates the respective test segment circuit and configured to receive a second signal that clocks the respective test segment circuit; and
a respective second latch circuit configured to receive a third signal from the first latch circuit and configured to transmit a fourth signal that activates an adjacent test segment circuit.

2. The apparatus of claim 1, wherein the respective first latch circuit further configured to receive a fifth signal that enables testing of each segment line of the plurality of segment lines, and wherein the respective second latch circuit further configured to receive an inverted version of the fifth signal.

3. The apparatus of claim 2, wherein each test segment circuit coupled to the respective portion of the third signal line via a coupling to the respective first latch circuit and a coupling to a first inverter configured to receive an inverted fifth signal that activates the second latch circuit.

4. The apparatus of claim 1, wherein each test segment circuit comprises:
a transistor configured to receive, at a first node of the transistor, the third signal, the third signal received from the first latch circuit; and
a switch, coupled to the transistor, configured to receive a sixth signal that activates the switch, the sixth signal received from the first latch circuit.

5. The apparatus of claim 4, wherein each test segment circuit coupled to the respective portion of the second signal line via a coupling to the transistor and a coupling to the switch.

6. The apparatus of claim 5, wherein the respective portion of the second signal line is configured to supply the transistor when the third signal activates a pull-down mode of the transistor.

7. The apparatus of claim 5, wherein the switch is configured to decouple preceding segment lines relative to respective segment line, when the third signal activates the pull-down mode of the transistor, to the subsequent segment lines of the respective segment line.

8. The apparatus of claim 7, wherein, when the third signal activates the pull-down mode of the transistor, a die crack detection circuit configured to test the head or tail of the second signal line for a die crack in the die.

9. The apparatus of claim 1, wherein each test segment circuit comprises:
a second inverter configured to provide the second signal that clocks the respective test segment circuit;
a NAND gate; and
a third inverter coupled to the NAND gate and configured to receive an output of the NAND gate responsive to an output of the second latch circuit.

10. The apparatus of claim 9, wherein each test segment circuit is coupled to the respective portion of the first signal line via a coupling to the NAND gate and the third inverter.

* * * * *